US010825967B2

(12) United States Patent
Hayashi et al.

(10) Patent No.: US 10,825,967 B2
(45) Date of Patent: Nov. 3, 2020

(54) LIGHT EMITTING DEVICE, METHOD OF MANUFACTURING COVERING MEMBER, AND METHOD OF MANUFACTURING LIGHT EMITTING DEVICE

(71) Applicant: NICHIA CORPORATION, Anan-shi, Tokushima (JP)

(72) Inventors: Tadao Hayashi, Tokushima (JP); Teruhito Azuma, Anan (JP); Suguru Beppu, Anan (JP); Kunihiro Izuno, Anan (JP); Tsuyoshi Okahisa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/447,935

(22) Filed: Jun. 20, 2019

(65) Prior Publication Data

US 2019/0312183 A1 Oct. 10, 2019

Related U.S. Application Data

(62) Division of application No. 15/167,570, filed on May 27, 2016, now Pat. No. 10,374,134.

(30) Foreign Application Priority Data

May 29, 2015 (JP) ................................. 2015-109807
Feb. 23, 2016 (JP) ................................. 2016-031940

(51) Int. Cl.
*H01L 33/50* (2010.01)
*H01L 33/48* (2010.01)
(Continued)

(52) U.S. Cl.
CPC ............ *H01L 33/507* (2013.01); *H01L 33/48* (2013.01); *H01L 33/505* (2013.01);
(Continued)

(58) Field of Classification Search
None
See application file for complete search history.

(56) References Cited

U.S. PATENT DOCUMENTS

2007/0007540 A1 1/2007 Hashimoto et al.
2009/0296367 A1 12/2009 Sekine et al.
(Continued)

FOREIGN PATENT DOCUMENTS

DE 10 2013 214 877 A1 2/2015
DE 10 2013 214 896 A1 2/2015
(Continued)

OTHER PUBLICATIONS

Non-Final Office Action on U.S. Appl. No. 15/167,570 dated Sep. 17, 2018.
(Continued)

*Primary Examiner* — Steven B Gauthier
(74) *Attorney, Agent, or Firm* — Foley & Lardner LLP

(57) ABSTRACT

A method of manufacturing a covering member includes: providing a first light-reflective member comprising a through-hole, the through-hole having first and second openings; arranging a light-transmissive resin containing a wavelength-conversion material within the through-hole; distributing the wavelength-conversion material predominantly on a side of the first opening of the through-hole within the light-transmissive resin; and after the step of distributing the wavelength-conversion material, removing a portion of the light-transmissive resin from a side of the second opening of the through-hole.

3 Claims, 19 Drawing Sheets

(51) Int. Cl.
*H01L 33/58* (2010.01)
*H01L 33/60* (2010.01)

(52) U.S. Cl.
CPC ............ *H01L 33/508* (2013.01); *H01L 33/58* (2013.01); *H01L 33/60* (2013.01); *H01L 2933/005* (2013.01); *H01L 2933/0033* (2013.01); *H01L 2933/0041* (2013.01); *H01L 2933/0058* (2013.01)

(56) References Cited

U.S. PATENT DOCUMENTS

| | | |
|---|---|---|
| 2011/0309388 A1 | 12/2011 | Ito et al. |
| 2012/0018772 A1 | 1/2012 | Nishijima et al. |
| 2012/0262054 A1 | 10/2012 | Ooyabu et al. |
| 2013/0193837 A1 | 8/2013 | Ohno et al. |
| 2013/0240931 A1* | 9/2013 | Akimoto ............... H01L 33/58 257/98 |
| 2014/0001657 A1 | 1/2014 | Ebe et al. |
| 2014/0001948 A1 | 1/2014 | Katayama et al. |
| 2014/0001949 A1 | 1/2014 | Kimura et al. |
| 2014/0004632 A1* | 1/2014 | Lin ...................... H01L 33/502 438/27 |
| 2014/0146547 A1 | 5/2014 | Tsutsumi et al. |
| 2014/0367729 A1 | 12/2014 | Ebe et al. |
| 2015/0188001 A1 | 7/2015 | Schricker et al. |
| 2015/0200339 A1* | 7/2015 | Markytan ............. H01L 33/505 257/98 |
| 2015/0318453 A1* | 11/2015 | Hung ................... H01L 33/508 257/98 |
| 2016/0155912 A1 | 6/2016 | Burger et al. |
| 2016/0276551 A1 | 9/2016 | Schricker et al. |
| 2018/0212118 A1* | 7/2018 | Chen .................... H01L 33/508 |

FOREIGN PATENT DOCUMENTS

| | | |
|---|---|---|
| EP | 2 642 537 A2 | 9/2013 |
| EP | 2 680 330 A2 | 1/2014 |
| JP | H11-074561 A | 3/1999 |
| JP | 2004-186488 A | 7/2004 |
| JP | 2005-158957 A | 6/2005 |
| JP | 2007-214249 A | 8/2007 |
| JP | 2007-227791 A | 9/2007 |
| JP | 2010-192629 A | 9/2010 |
| JP | 2010-219324 A | 9/2010 |
| JP | 2010-283281 A | 12/2010 |
| JP | 2012-134355 A | 7/2012 |
| JP | 2012-222317 A | 11/2012 |
| JP | 2013-038115 A | 2/2013 |
| JP | 2013-077679 A | 4/2013 |
| JP | 2013-153105 A | 8/2013 |
| JP | 2013-197309 A | 9/2013 |
| JP | 2014-168033 A | 9/2014 |
| JP | 2014-168034 A | 9/2014 |
| JP | 2014-168035 A | 9/2014 |
| WO | WO-2006/101174 A1 | 9/2006 |
| WO | WO-2014/013406 A1 | 1/2014 |
| WO | WO-2015/014874 A1 | 2/2015 |

OTHER PUBLICATIONS

Notice of Allowance on U.S. Appl. No. 15/167,570 dated Mar. 21, 2019.

U.S. Office Action on U.S. Appl. No. 15/167,570 dated Jul. 13, 2017.

U.S. Office Action on U.S. Appl. No. 15/167,570 dated Nov. 17, 2017.

* cited by examiner

LIGHT EMITTING DEVICE, METHOD OF MANUFACTURING COVERING MEMBER, AND METHOD OF MANUFACTURING LIGHT EMITTING DEVICE

CROSS-REFERENCE TO RELATED APPLICATIONS

This application is a divisional of U.S. patent application Ser. No. 15/167,570, filed on May 27, 2016, which claims the benefit of Japanese Patent Application No. 2015-109807, filed on May 29, 2015, and Japanese Patent Application No. 2016-031940, filed on Feb 23, 2016, the disclosures of which are incorporated by reference in their entireties.

BACKGROUND

The present disclosure relates to a light emitting device, a method of manufacturing a covering member, and a method of manufacturing the light emitting device.

In recent years, light-emitting diodes have been used in various forms in the fields of general illumination, vehicle-mounted illumination, and the like, with the improvement of their qualities.

For example, a light emitting device is known in which a plate-shaped optical member including an outer frame is disposed over a light-emitting element to be thinned. (see JP 2012-134355 A.)

SUMMARY

Light emitting devices are required to be much thinner than the conventional ones.

It is an object of certain embodiments of the present invention to provide a light emitting device that can be thinned, a method of manufacturing the same, and a method of manufacturing a covering member.

A method of manufacturing a covering member according to one embodiment of the present invention includes: providing a first light-reflective member having a through-hole; arranging a light-transmissive resin containing a wavelength-conversion material within the through-hole; distributing the wavelength-conversion material predominantly on a side of one opening of the through-hole within the light-transmissive resin; and after the distributing of the wavelength-conversion material, removing a portion of the light-transmissive resin from a side of the other opening of the through-hole.

A light emitting device according to one embodiment of the present invention includes: a covering member including a first light-reflective member having a through-hole and a light-transmissive resin disposed in the through-hole; a light-emitting element arranged to face the light-transmissive resin; and a second light-reflective member arranged to face the first light-reflective member around the light-emitting element, the second light-reflective member covering a lateral surface of the light-emitting element. The light-transmissive resin contains a wavelength-conversion material distributed predominantly on a side of a lower surface of the light-transmissive resin facing the light-emitting element, or predominantly on a side of an upper surface of the light-transmissive resin, the side of the upper surface apart from the light-emitting element.

According to certain embodiments of the present invention, a light emitting device that can be thinned can be obtained.

DETAILED DESCRIPTION

Figure 1A:
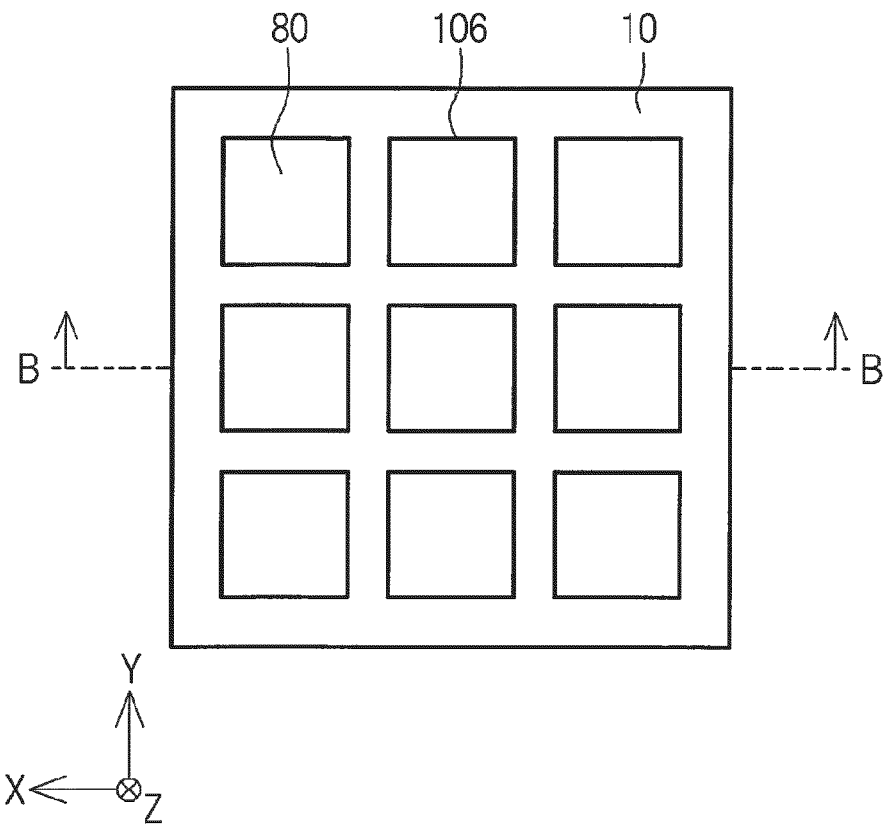
FIG. 1A is a schematic plan view showing a method of manufacturing a covering member in a method of manufacturing a light emitting device according to a first embodiment.
Figure 1B:
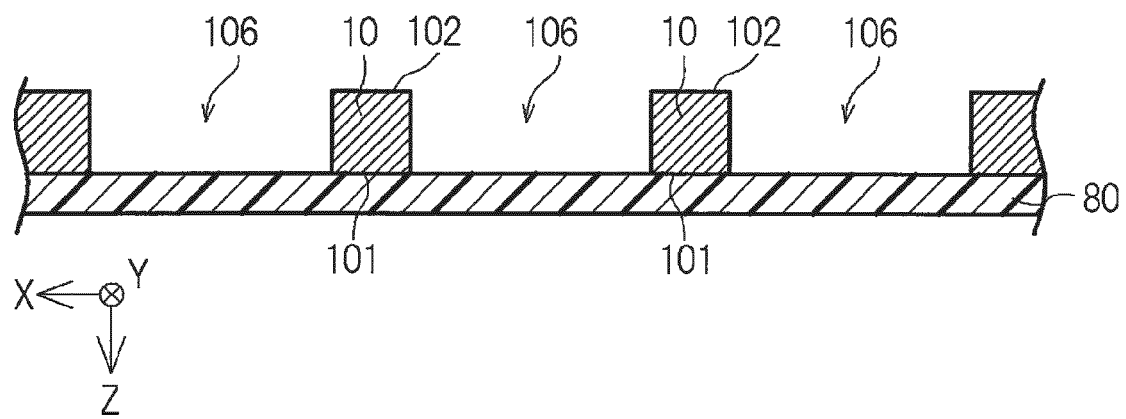
FIG. 1B is a schematic cross-sectional view taken along the line B-B of FIG. 1A.

Embodiments of the present invention will be described in detail below with reference to the accompanying drawings. In the description below, the terms (e.g., upper, lower, and other words including these words) indicative of specific directions or positions are used as appropriate. The use of these terms is for ease of understanding of the present invention with reference to the drawings, and does not limit the technical range of the present invention by their meanings. The same reference characters represented through the drawings denote the same parts or members.

First Embodiment

A method of manufacturing a light emitting device in the first embodiment will be described with reference to FIGS. 1A to 6C.

The method of manufacturing a light emitting device in the first embodiment includes the steps of:

(1) manufacturing a covering member that includes a first light-reflective member having a plurality of through-holes, a light-transmissive resin arranged in each through-hole to have substantially the same thickness as the first light-reflective member, and a wavelength-conversion material contained in the light-transmissive resin to be distributed predominantly on a side of one opening of the through-hole;

(2) fixing light-emitting elements over the respective light-transmissive resins provided in the through-holes;

(3) forming a second light-reflective member between the adjacent light-emitting elements provided on or over the light-transmissive resin; and (4) separating the individual light emitting devices by cutting the first light-reflective member and the second light-reflective member in between these adjacent light-emitting elements.

In the method of manufacturing a light emitting device in the embodiment described above, the coating material including the light-transmissive resin is used to manufacture the light emitting device; the light-transmissive resin contains the wavelength-conversion material distributed predominantly on one opening side of the through-hole. With this method, a thin light emitting device can be manufactured.

The method of manufacturing the light emitting device in the present embodiment will be specifically described below.

Fabrication of Covering Member

Referring to FIGS. 1A to 3C, steps of manufacturing a covering member 70 in this embodiment will be described below. The covering member 70 fabricated in these steps of manufacturing includes a first light-reflective member 10 and a light-transmissive resin 30 containing a wavelength-conversion material 20.

Step 1-1. Preparation of the First Light-Reflective Member with Through-Holes

The first light-reflective member 10 with through-holes 106 is prepared. The through-hole 106 penetrates a first surface 101 of the first light-reflective member 10 and a second surface 102 which is opposite to the first surface (see FIGS. 1A and 1B). Note that only one through-hole 106 may be formed in the first light-reflective member 10, or alternatively a plurality of through-holes 106 may be formed therein.

Figure 2A:
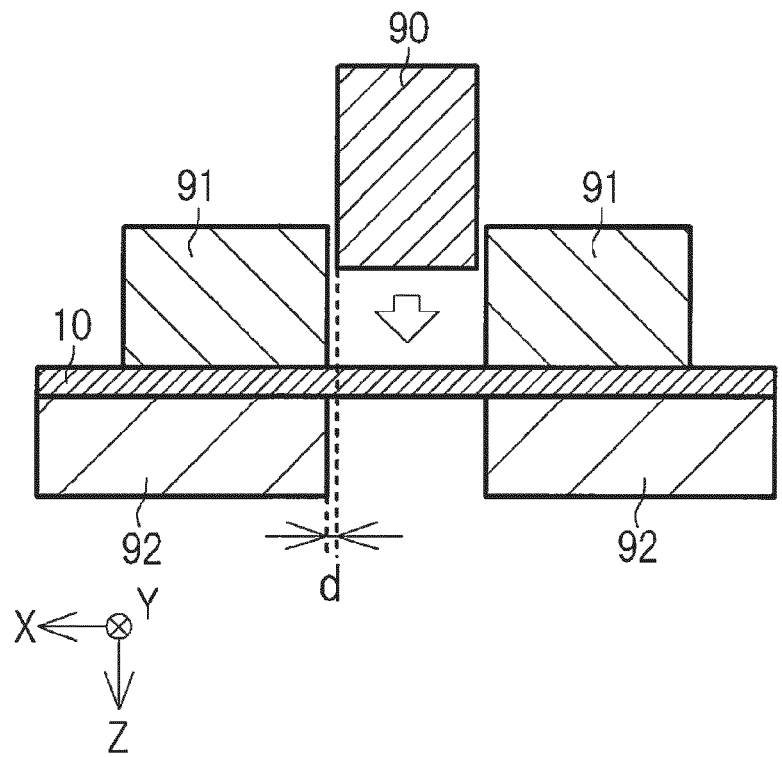
FIG. 2A is a schematic cross-sectional view showing a state in which a first light-reflective member is held when punching is performed in the method of manufacturing the covering member according to the first embodiment.
Figure 2B:
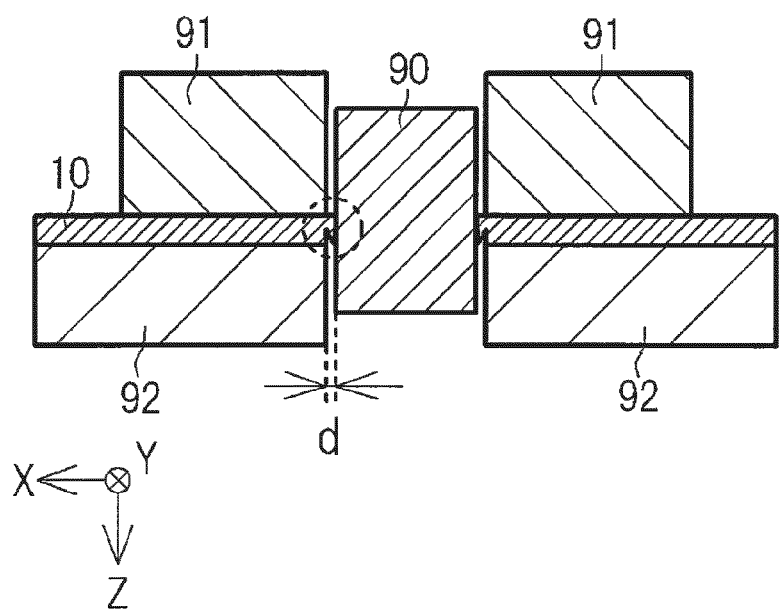
FIG. 2B is a schematic cross-sectional view showing a state in which an upper die is driven into a first light reflective member when the punching is performed in the method of manufacturing the covering member according to the first embodiment.
Figure 2C:
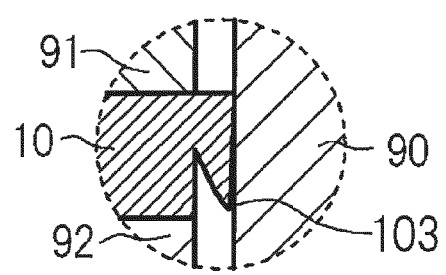
FIG. 2C is an enlarged view of a portion enclosed by a dotted line of FIG. 2B.

To form the through-holes 106 in the first light-reflective member 10, any method known in the art may be used. Examples of the formation method include irradiation or drawing using laser beam, punching, etching, blasting, and the like. The through-hole 106 preferably has a protrusion 103 at its sidewall. The protrusion can enhance an adhesive force between the light-transmissive resin 30 and the first light-reflective member 10 as described below. In the case of using resin or metal for the first light-reflective member 10, forming the through-holes 106 by punching allows the protrusion 103 to be easily formed on the sidewall of the through-hole 106. That is, during punching, as shown in FIG. 2A, the first light-reflective member 10 is vertically held by a holding member 91 and a lower die 92. The upper die 90 is pressed downward to the first light-reflective member held in this way, so that the through-hole 106 in the first light-reflective member 10 is formed. At this time, control of a distance of a gap d between the upper die 90 and the lower die 92 allows for forming the protrusion 103 at a predetermined position. The gap d between the upper die 90 and the lower die 92 corresponds to a distance between the upper die 90 and the lower die 92 in the X direction (horizontal direction) in FIG. 2A. For example, the gap d is adjusted at the time of forming the through-hole 106 from the upper to lower direction, which can form the protrusion 103 as a protruding portion (obliquely formed) that protrudes downward (see FIGS. 2B and 2C). In other words, the protrusion 103 may be inclined downward. This is because the position of the first light-reflective member 10 to which a force is applied from the upper die 90 is distant from the position to which a force is applied from the lower die 92, by the gap d between the upper die 90 and the lower die 92. Adjustment of the distance of the gap d can also form the through-hole with a plurality of protrusions 103 at the sidewalls thereof. The gap d between the upper die 90 and the lower die 92 may have an appropriate distance, but is preferably in a range of 1 to 30 µm to form an inclined protrusion, and preferably in a range of 0 to 30 µm (excluding 0) to form a plurality of protrusions. Furthermore, the distance of the gap d between the upper and lower dies 90 and 92 relative to the thickness of the first light-reflective member 10 is preferably in a range of 1 to 30% to form an inclined protrusion, and preferably in a range of 0 to 30% (excluding 0%) to form a plurality of protrusions.

Note that the first light-reflective member 10 with the through-hole 106 may be formed by compression molding, transfer molding, injection molding, etc., that use a mold. The formation of the first light-reflective member 10 in this way can suppress variance in shape of the first light-reflective member 10 with the through-holes 106.

After preparing the first light-reflective member 10 with the through-holes 106 is prepared, the first light-reflective member 10 with the through-holes is placed on a support member 80 made of a heat-resistant sheet or the like.

Step 1-2. Arranging of a Light-Transmissive Resin 30 Containing the Wavelength-Conversion Material 20

Figure 3A:
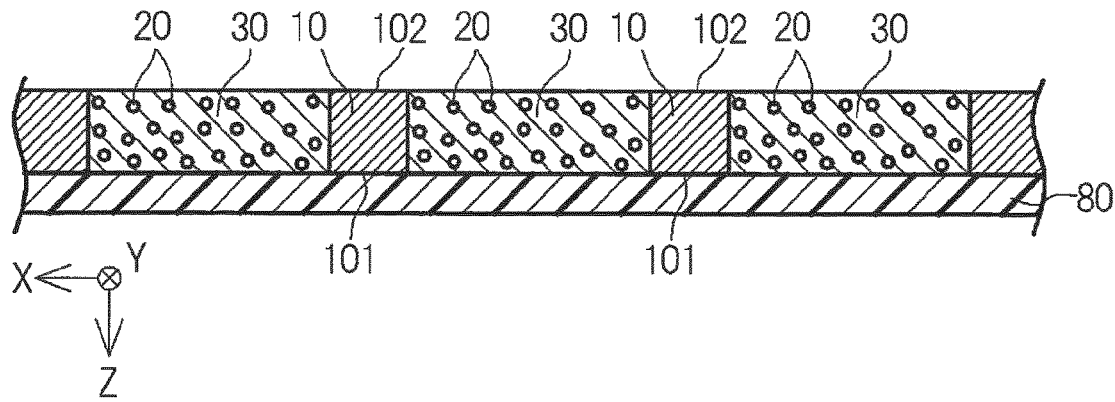
FIG. 3A is a schematic cross-sectional view of a state in which light-transmissive resin containing a wavelength-conversion material is disposed in through-holes of the first light-reflective member in the method of manufacturing the covering member according to the first embodiment.

Next, the light-transmissive resin 30 containing wavelength-conversion material 20 is arranged within each through-hole 106 (see FIG. 3A). To arrange the light-transmissive resin 30 containing the wavelength-conversion material 20, any method known in the art may be used. The known methods include printing, potting, etc. Note that the light-transmissive resin 30 should be in a state of making the wavelength-conversion material 20 movable within the light-transmissive resin 30. That is, the light-transmissive resin 30 may be in the liquid state before curing, or in a semi-cured state. The light-transmissive resin 30 in the liquid state is preferable as it makes it easier for the wavelength-conversion material 20 to move therein, compared to that in the semi-cured state. Further, a light diffusion material may be contained in the light-transmissive resin 30.

Step 1-3. Distributing the Wavelength-Conversion Material 20

Figure 3B:
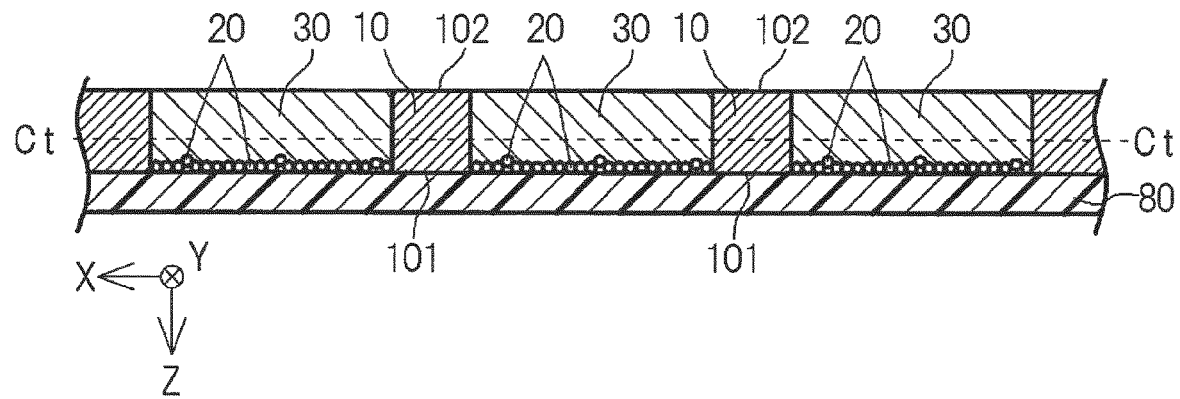
FIG. 3B is a schematic cross-sectional view of a state in which the wavelength-conversion material is eccentrically distributed within the through-holes of the first light-reflective member in the method of manufacturing the covering member according to the first embodiment.
Figure 3C:
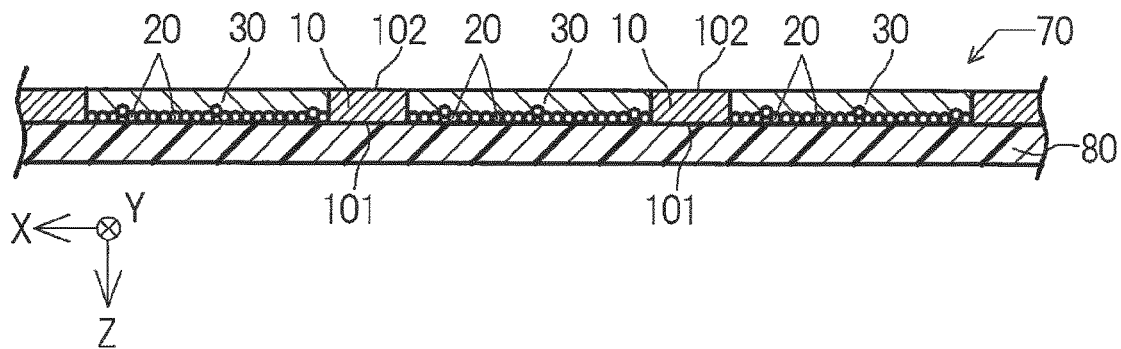
FIG. 3C is a schematic cross-sectional view of a state in which the light-transmissive resin and the first light-reflective member are partially removed in the manufacturing method for the covering member according to the first embodiment.

The wavelength-conversion material 20 is distributed predominantly on the first surface 101 side within the light-transmissive resin 30 due to spontaneous precipitation or forced precipitation (see FIG. 3B). Examples of the forced precipitation includes centrifugal sedimentation that precipitates the wavelength-conversion material 20 due to the centrifugal force generated by the rotation. After precipitating the wavelength-conversion material 20, the light-transmissive resin 30 is cured by heating or the like. As a result, the light-transmissive resin 30 in which the wavelength-conversion material 20 is distributed predominantly on the first surface 101 side is obtained. Note that in the case where the light diffusion material is contained in the light-transmissive resin 30, it may be unevenly distributed in the same manner as the wavelength-conversion material 20. However, the light diffusion material is preferably dispersed uniformly without being unevenly located in the light-transmissive resin 30.

Step 1-4. Removal of the First Light-Reflective Member and the Light-Transmissive Resin Upper parts of the first light-reflective member and the light-transmissive resin that are located above the dashed line Ct-Ct of FIG. 3B are removed. That is, the "first light-reflective member 10 on the second surface side" and the "light-transmissive resin 30 on the side opposite to the side where the wavelength-conversion material 20 is predominantly distributed" are removed (see FIG. 3C). To remove the first light-reflective member 10 and the light-transmissive resin 30, any method known in the art can be used. Examples of the method for removing can include etching, cutting, grinding, polishing, blasting, and the like. Thus, the light-transmissive resin 30 can be thinned without substantially changing the content of the wavelength-conversion material 20. That is, the thinned covering member 70 can be obtained. At the time of removing the first light-reflective member and the light-transmissive resin by the etching, cutting, grinding, polishing, blasting, or the like, the "first light-reflective member 10 on the second surface side" and the "light-transmissive resin 30 on the side opposite to the side where the wavelength-conversion material 20 is predominantly distributed" may have rough surfaces. Roughing these surfaces leads to reduction of the tackiness (adhesion) thereof, which can make it easier to handle them, for example, at the time of mounting.

Here, in the present specification, regardless of before or after the removal of the light-transmissive resin 30 or the like, the surface of the first light-reflective member 10 where the wavelength-conversion material 20 is predominantly distributed is referred to as a "first surface", while the surface opposite to the first surface is referred to as a "second surface".

Through the steps mentioned above, the covering member 70 held by the support member 80 can be obtained.

Fabrication of the Light Emitting Device

Step A-1. Fixing of the Light-Emitting Element 40

Figure 4A:
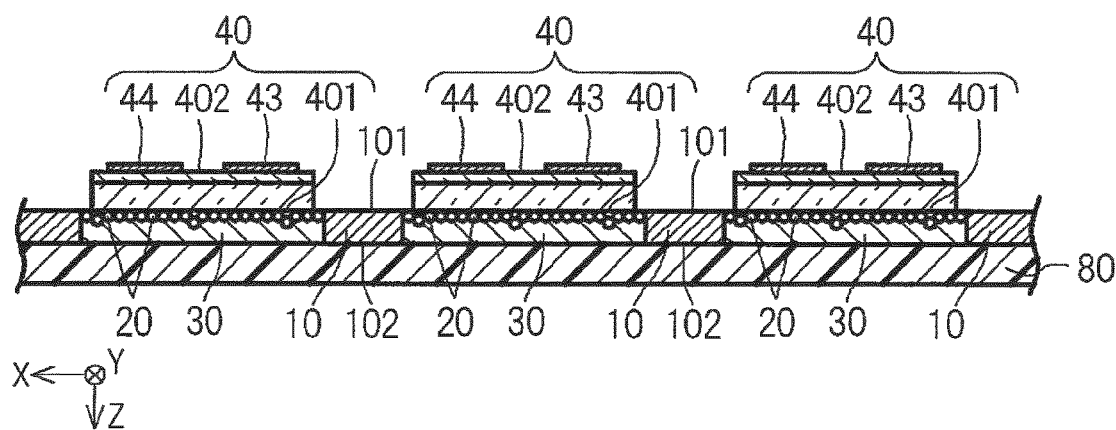
FIG. 4A is a schematic cross-sectional view showing a state in which light-emitting elements are fixed in the method of manufacturing the light emitting device according to the first embodiment.

The light-emitting element is fixed onto the light-transmissive resin 30 of the covering member 70 manufactured by the above-mentioned method (see FIG. 4A). For example, the light-transmissive resin 30 and a light extraction surface 401 of the light-emitting element 40 are bonded together via a bonding member 60 (see FIG. 4C). Even in the case where the light-transmissive resin 30 is not adhesive, the use of the bonding member 60 allows for bonding the light-emitting element 40 to the light-transmissive resin 30. The bonding member 60 is preferably formed up to the lateral surfaces of the light-emitting element 40, thus improving the adhesive force between the light-emitting element 40 and the light-transmissive resin 30. Note that the surface of the light-transmissive resin 30 where the wavelength-conversion material 20 is predominantly distributed may be bonded to the light extraction surface 401 of the light-emitting element 40. Alternatively, a surface of the light-transmissive resin 30 opposite to the surface thereof where the wavelength-conversion material 20 is predominantly distributed may be bonded to the light extraction surface 401 of the light-emitting element.

Step A-2. Formation of a Second Light-Reflective Member

Figure 4B:
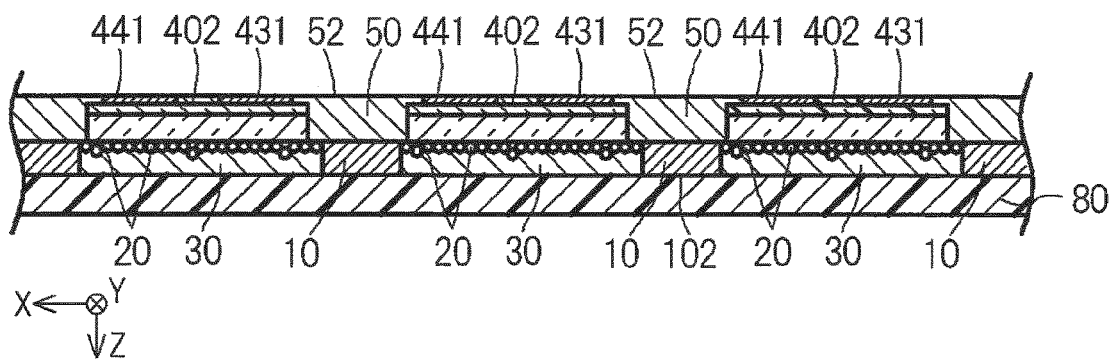
FIG. 4B is a schematic cross-sectional view showing a state in which a second light-reflective member is formed in the method of manufacturing the light emitting device according to the first embodiment.
Figure 4C:
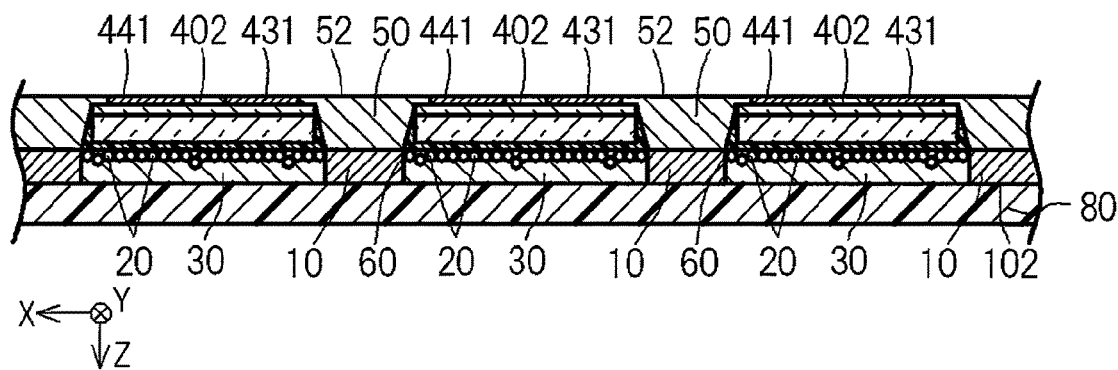
FIG. 4C is a schematic cross-sectional view showing a state in which the second light-reflective member is formed in the case of including a bonding member in the method of manufacturing the light emitting device according to the first embodiment.

A second light-reflective member 50 is formed to cover portions of the lateral surfaces of the light-emitting element 40 and the first light-reflective member 10 (see FIG. 4B). The second light-reflective member 50 is bonded to the first-reflective member 10 around the light-emitting element 40. In the case where the light-emitting element 40 and the light-transmissive resin 30 are bonded together by using the bonding member 60, the second light reflective member 50 may cover the bonding member 60 (see FIG. 4C). Further, a portion of an electrode formation surface 402 of the light-emitting element 40 that is not covered by the electrodes 43 and 44 may be covered by the second light-reflective member 50. In this case, the thickness of the second light-reflective member 50 (the dimension thereof in the Z direction) may be adjusted to expose parts of the electrodes 43 and 44 from the second light-reflective member 50. That is, when the first surface 101 of the first light-reflective member 10 is used as the basis for a height, the height of the second light-reflective member 50 up to the surface 52, which is opposite to the surface of the second light-reflective member 50 facing the first light-reflective member 10, may be equal to or lower than the height of each of the exposed surfaces 431 and 441 of the electrodes 43 and 44.

Figure 4D:
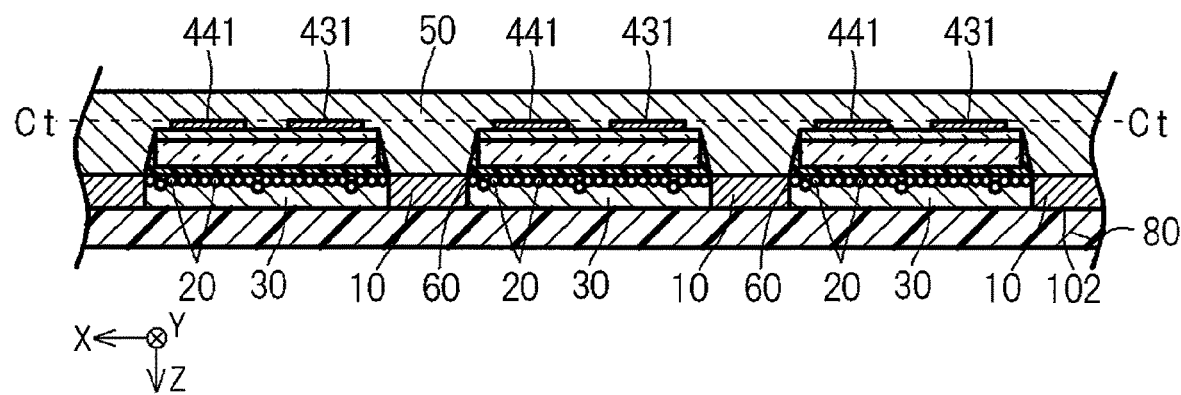
FIG. 4D is a schematic cross-sectional view showing a state in which the second light-reflective member is formed to embed electrodes of the light-emitting elements in the method of manufacturing the light emitting device according to the first embodiment.
Figure 5A:
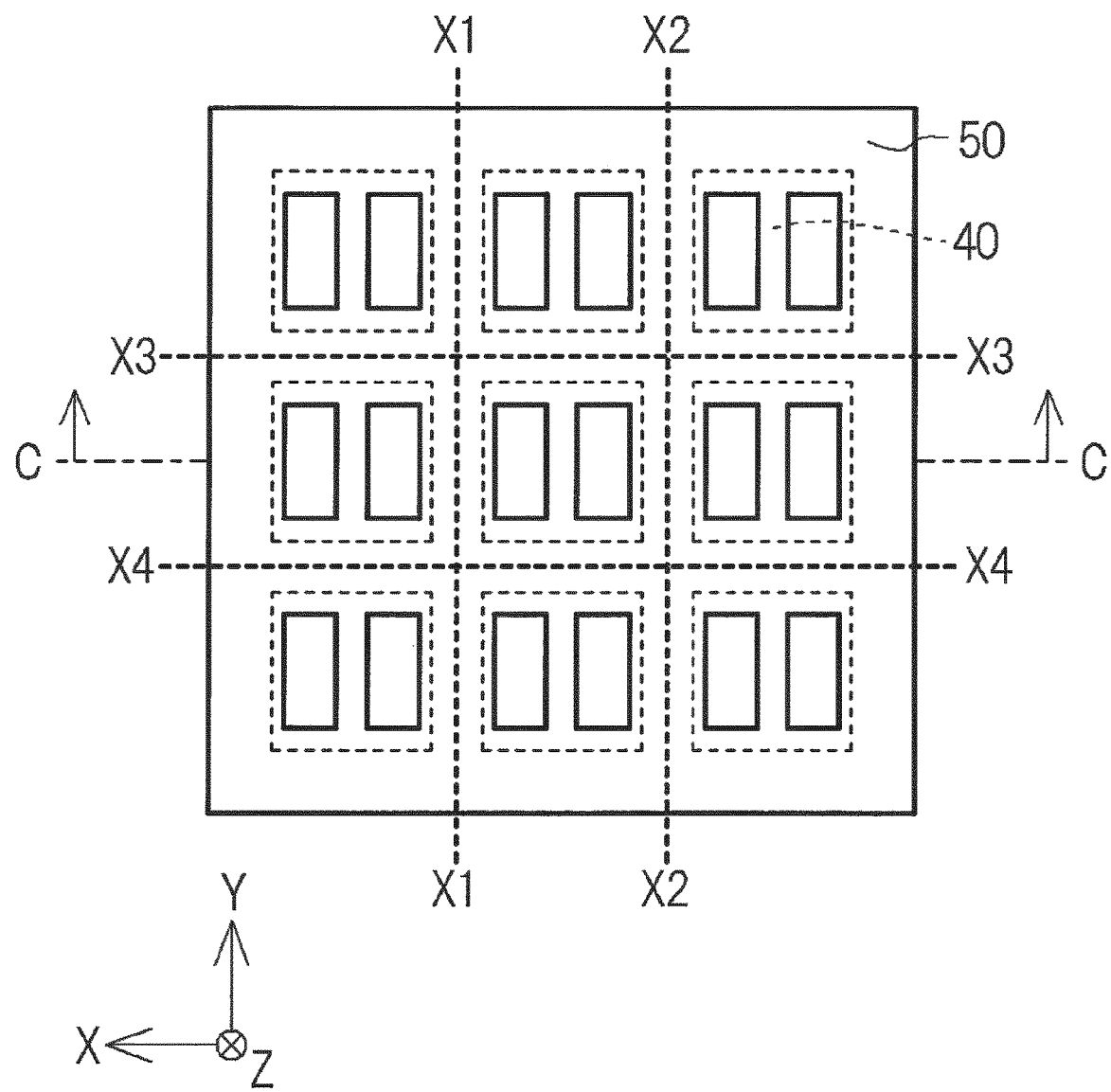
FIG. 5A is a schematic plan view showing cutting lines for separating into the light emitting devices in the method of manufacturing the light emitting device according to the first embodiment.
Figure 5B:
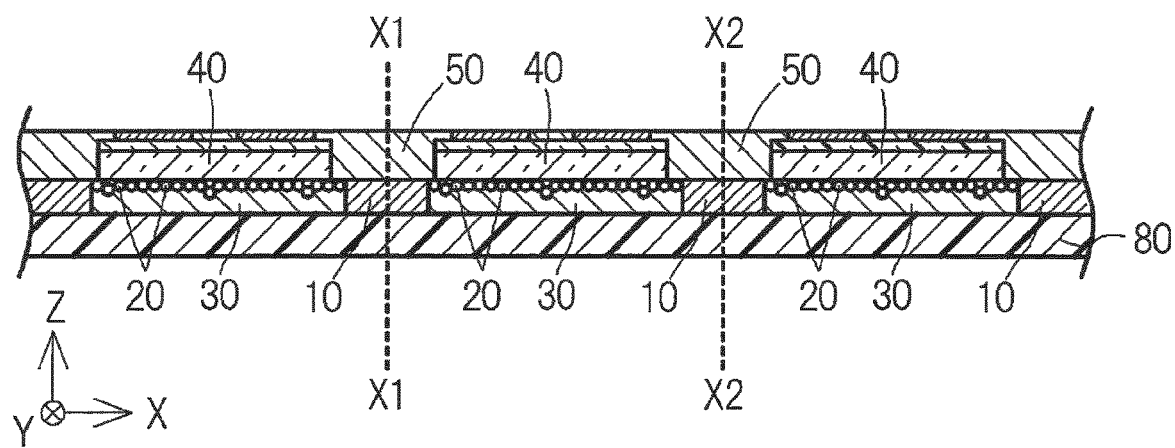
FIG. 5B is a schematic cross-sectional view taken along the line C-C of FIG. 5A.

The second light-reflective member 50 may be formed in the thickness that embeds therein the electrodes 43 and 44 (see FIG. 4D). Thereafter, the part of the second light-reflective member 50 above the dashed line Ct-Ct of FIG. 4D is removed. That is, a portion of the second light-reflective member 50 may be removed to expose the electrodes 43 and 44. To remove the second light-reflective member 50, any method known in the art may be used. Examples of the removing method include etching, cutting, grinding, polishing, blasting, and the like. The second light-reflective member 50 is preferably removed by etching, cutting, grinding, polishing, blasting, or the like, which can flatten the surface 52 of the second light-reflective member 50 opposite to the other surface thereof facing the first light-reflective member 10.

Step A-3. Singulation of the Light Emitting Device

Figure 6A:
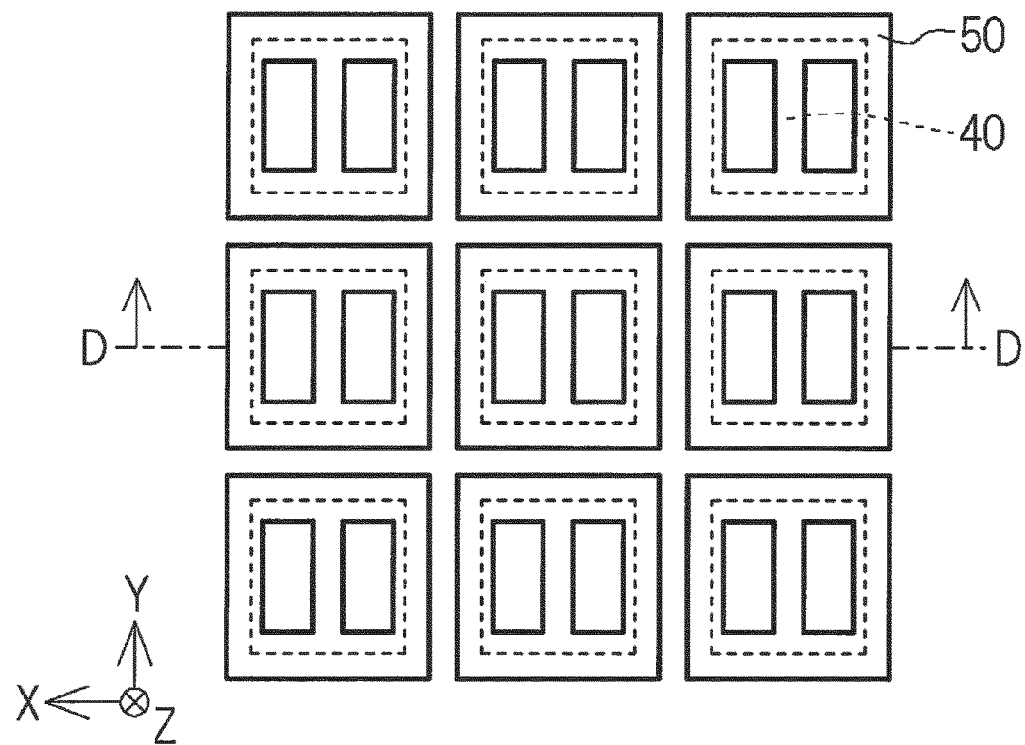
FIG. 6A is a schematic plan view showing the individual light emitting devices after singulation in the method of manufacturing the light emitting device according to the first embodiment.
Figure 6B:
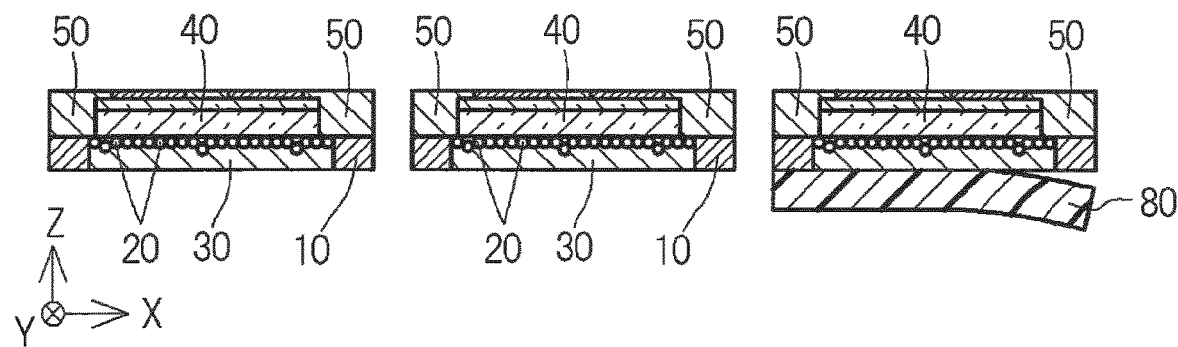
FIG. 6B is a schematic cross-sectional view taken along the line D-D of FIG. 6A.
Figure 6C:
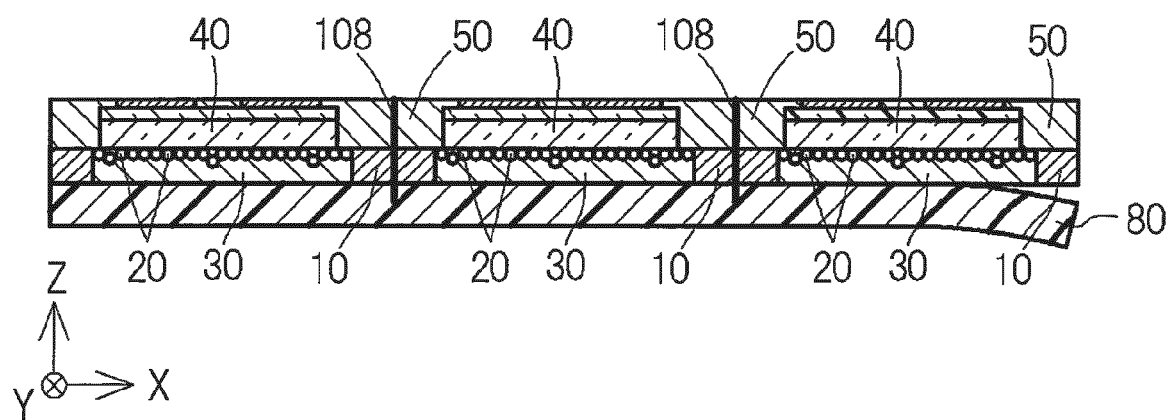
FIG. 6C is a schematic cross-sectional view showing a modified example of the singulation in the method of manufacturing the light emitting device according to the first embodiment.

The first light-reflective member and the second light-reflective member between the adjacent light-emitting elements are cut to separate into individual light-emitting devices. Specifically, the first light-reflective member 10, the second light-reflective member 50, and the support member 80 are cut, for example, by a dicer or the like, along dashed lines X1, X2, X3, and X4, each of which extends through the part between the adjacent light-emitting elements 40, to perform the singulation (see FIGS. 5A and 5B). Finally, the support member 80 is removed, so that the light emitting devices is produced (see FIGS. 6A and 6B). Preferably, the support member 80 is not completely cut at the time of cutting the first light-reflective member 10, the second light-reflective member 50, and the support member 80. That is, as shown in FIG. 6C, preferably, the first reflective member 10 and the second reflective member 50 are separated by the cutting portions 108, while the support member 80 is not cut out. With this arrangement, the support member 80 is not separated into a plurality of parts, so that the support member 80 can be removed at one time. Note that the support member 80 may be removed before cutting, and then the first light-reflective member 10 and the second light-reflective member 50 may be cut. With such cutting, a plurality of light emitting devices, each having one light-emitting element 40, can be manufactured at the same time. Alternatively, cutting may be performed in such positions as to contain a plurality of light-emitting elements 40 in one light emitting device.

In the above-mentioned first embodiment, the first light-reflective member and/or light-transmissive resin 30 are removed through steps 1 to 4 to thereby produce the thinned covering member 70, and the thus-obtained covering member 70 is used to perform the steps A-1 to A-3.

However, in the method of manufacturing the light emitting device in the first embodiment, after the step 1-3 and the steps A-1 and A-2 are performed subsequently, the first light-reflective member and/or the light-transmissive resin 30 may be removed to thin the covering member 70. Further, in the method of manufacturing the light emitting device in the first embodiment, after the step 1-3, and the steps A-1 to A-3 are performed subsequently, the first light-reflective member and/or the light-transmissive resin 30 may be removed in each of the light emitting devices to thin the covering member 70.

Second Embodiment

A method of manufacturing a light emitting device in the second embodiment will be described below.

The method of manufacturing the light emitting in the second embodiment is substantially the same as that in the first embodiment except that the covering member is fabricated in a way different from that of the first embodiment.

The fabrication method of the covering member in this embodiment will be described below.

Fabrication of Covering Member

Step 2-1. Preparation of the First Light-Reflective Member

Figure 7A:
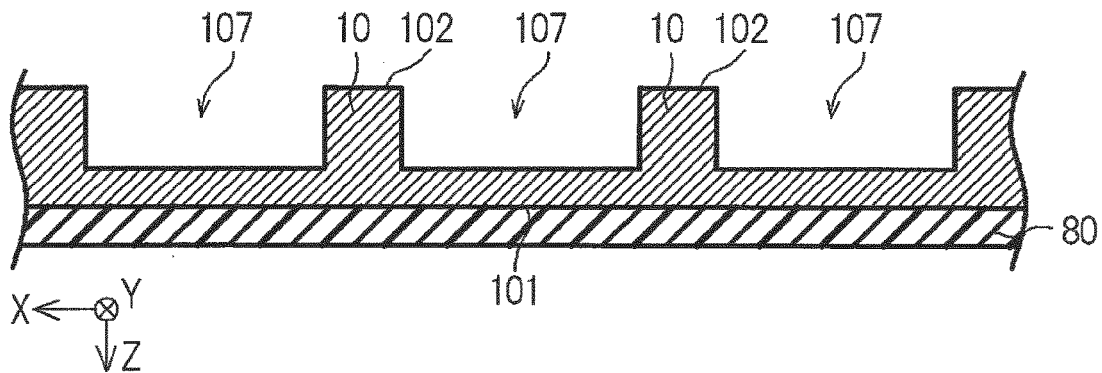
FIG. 7A is a schematic cross-sectional view showing a state in which a first light-reflective member with recesses is formed over a support member in a method of manufacturing a covering member according to a second embodiment.

A first light-reflective member 10 with recesses 107 is formed over the support member 80 made of a heat-resistant sheet or the like. In the case where the surface of the first light-reflective member 10 opposite to the support member 80 is referred to as a first surface 101 while the surface opposite to the first surface is referred to as a second surface 102, the recesses 107 are formed to be opened on the side of the second surface 102 (see FIG. 7A).

Step 2-2. Placing of the Light-Transmissive Resin 30 Containing the Wavelength-Conversion Material 20

Figure 7B:
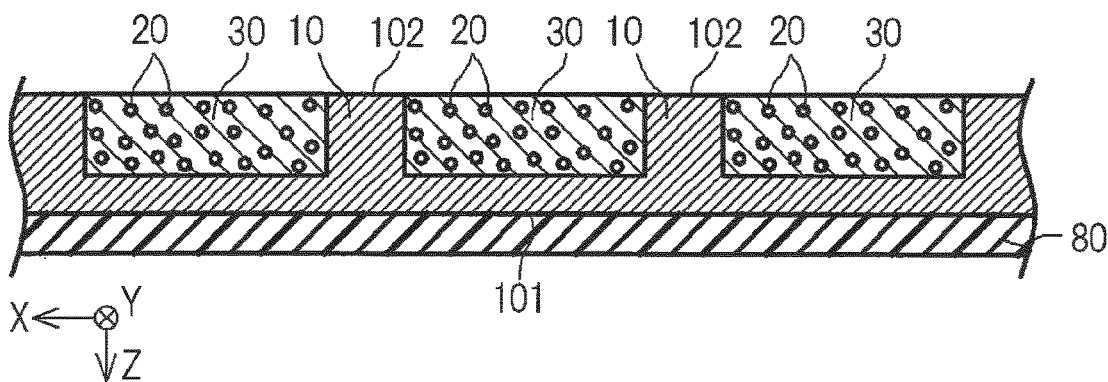
FIG. 7B is a schematic cross-sectional view showing a state in which a light-transmissive resin containing a wavelength-conversion material is disposed in the recesses in the method of manufacturing the covering member according to the second embodiment.

Then, the light-transmissive resin 30 containing the wavelength-conversion material 20 is placed within each through-hole 107 (see FIG. 7B). To place the light-transmissive resin 30 containing the wavelength-conversion material 20, any method known in the art may be used. Examples of the known method include printing, potting, etc. Note that the light-transmissive resin 30 should be in a state of making the wavelength-conversion material 20 movable within the light-transmissive resin 30. That is, the light-transmissive resin 30 may be in the liquid state before curing, or in a semi-cured state. The light-transmissive resin 30 is preferably in the liquid state, since it allows the wavelength-conversion material 20 to easily move therein, compared to that in the semi-cured state.

Step 2-3. Distributing the Wavelength-Conversion Material 20

Figure 7C:
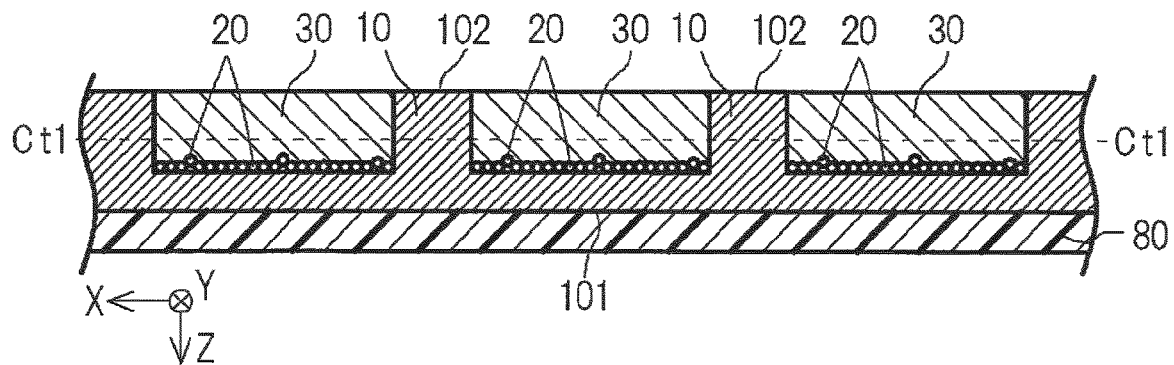
FIG. 7C is a schematic cross-sectional view of a state in which the wavelength-conversion material is eccentrically distributed in the light-transmissive resin within the recesses in the method of manufacturing the covering member in the second embodiment.

The wavelength conversion material 20 is distributed predominantly on the first surface 101 side (on the bottom surface side of the recess) within the light-transmissive resin 30 due to the spontaneous precipitation or forced precipitation (see FIG. 7C). Thereafter, the light-transmissive resin 30 is cured by heating or the like. As a result, the light-transmissive resin in which the wavelength-conversion material 20 is eccentrically distributed predominantly on the first surface 101 side is obtained.

Step 2-4. Removal of the First Light-Reflective Member and the Light-Transmissive Resin Upper parts located above the dashed line Ct1-Ct1 of FIG. 7C are removed. That is, the "first light-reflective member on the second surface side" and the "light-transmissive resin 30 on the side opposite to the side where the wavelength-conversion material 20 is distributed predominantly" are removed. To remove the first light-reflective member 10 and the light-transmissive resin 30, any method known in the art may be used. Examples of the removing method include etching, cutting, grinding, polishing, blasting, and the like. With such removing, the first light-reflective member and the light-transmissive resin can be thinned while keeping the light-transmissive resin 30 on the side where the wavelength-conversion material 20 is predominantly distributed.

When removing the first light-reflective member and the light-transmissive resin by the etching, cutting, grinding, polishing, blasting, or the like, the "second surface side of first light-reflective member 10" and the "side of the light-transmissive resin 30 opposite to the side where the wavelength-conversion material 20 is predominantly distributed" may be roughened. Roughening these surfaces can reduce the tackiness thereof, which allows for easy handling.

Step 2-5. Removal of the First Light-Reflective Member

Figure 7D:
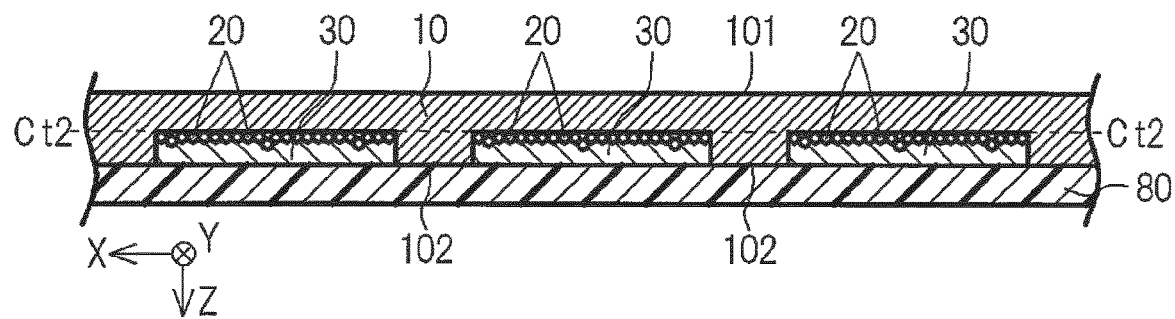
FIG. 7D is a schematic cross-sectional view showing a state in which the support member on the first light-reflective member is removed and then bonded to the opposite surface of the first light-reflective member in the method of manufacturing the covering member according to the second embodiment.
Figure 7E:
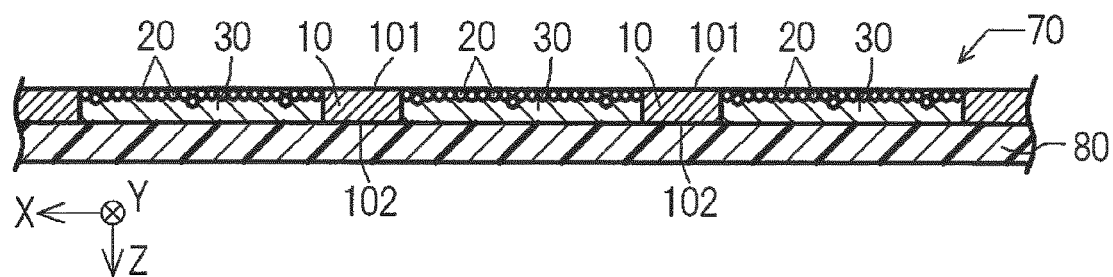
FIG. 7E is a schematic cross-sectional view showing a state in which the first light-reflective member is removed to allow the recesses to penetrate the first light reflective member in the method of manufacturing the covering member according to the second embodiment.

The support member 80 is removed from the first surface of the first light-reflective member 10, and then the support member 80 is bonded to the second surface of the first light-reflective member 10 (the surface opposite to the first surface) (see FIG. 7D). At this time, another support member 80 may be bonded to the second surface of the first light-reflective member 10, followed by removing the previous support member 80 from the first surface. Then, a portion of the "first light-reflective member on the first surface side" that is located above the dashed line Ct2-Ct2 of FIG. 7D is removed (see FIG. 7E). To remove the first light-reflective member 10, any method known in the art may be used. Examples of the removal method include etching, cutting, grinding, polishing, blasting, and the like. With such removing, the light-transmissive resin 30 containing the wavelength-conversion material 20 is also exposed from the first surface 101 side. That is, the thinned covering member 70 can be obtained. Note that either the step 2-4 or the step 2-5, which are steps of removing, may be performed first.

Third Embodiment

A method of manufacturing a light emitting device in a third embodiment differs from that in the first embodiment in that:

(1) While the light-transmissive resin 30 is cured in the step 1-3 in the first embodiment, in the method of manufacturing the light emitting device in the third embodiment, in the step 1-3, the light-transmissive resin 30 is brought into the semi-cured state to be adhesive, and adhesiveness of the light-transmissive resin 30 is kept until the light-emitting element 40 is fixed.

(2) While the light-emitting element 40 and the light-transmissive resin 30 are bonded together via the bonding member in the step A-1 in the first embodiment, in the method of manufacturing the light emitting device in the third embodiment, in step A-1, the light-emitting element 40 and the light-transmissive resin 30 are fixed together using the adhesiveness of the semi-cured light-transmissive resin 30.

The method of manufacturing the light emitting device in the third embodiment is the same as that in the first embodiment except for the above-mentioned (1) and (2).

In the method of manufacturing the light emitting device according to the third embodiment, the light-emitting element 40 and the light-transmissive resin 30 are fixed together using the adhesiveness of the semi-cured light-transmissive resin 30 based on the method of manufacturing the first embodiment.

Also in the method of manufacturing the second embodiment, the light-emitting element 40 and the light-transmissive resin 30 may be fixed together using the adhesiveness of the semi-cured light-transmissive resin 30.

In the method of manufacturing the light emitting device in the third embodiment as mentioned above, preferably, after the step 1-3 and the steps A-1 and A-2 are performed sequentially, the first light-reflective member and/or light-transmissive resin 30 are preferably removed to thin the covering member 70.

With the methods of manufacturing the light emitting device according to the first to the third embodiments, the covering member 70 can be thinned by grinding, polishing, or the like, which allows for easily manufacturing of the thinned light emitting device.

In the methods of manufacturing a light emitting device according to the first to the third embodiments as mentioned above, after the wavelength-conversion material 20 is distributed predominantly on one surface side of the light-transmissive resin 30, a region of the light-transmissive resin 30 where wavelength-conversion material 20 is not predominantly distributed is removed to thin the covering member 70.

With this arrangement, the thinned covering member 70 with small variations in content of the wavelength-conversion material 20 can be formed, so that variations in color tone of the light emitting device can be reduced. More specifically, if the wavelength-conversion material 20 is predominantly distributed without removing the region where the wavelength-conversion material 20 that is not predominantly distributed in order to fabricate a thin covering member including the wavelength-conversion material, a small amount of light-transmissive resin may be possibly applied into the through-holes or openings of the thin first light-reflective member.

However, if an amount of resin applied is small, variance in the amount of resin applied tends to increase, which may cause large variance in the content of the wavelength-conversion material in the light-transmissive resin. After the wavelength-conversion material 20 is predominantly distributed on one surface side of the light-transmissive resin 30, the region of the light-transmissive resin 30 where the wavelength-conversion material 20 is not predominantly distributed is removed to thin the covering member 70. In this case, the amount the light-transmissive resin that is applied into the through-holes or openings of the first light-reflective member can be relatively large. Accordingly, the thinned covering member 70 with small variance in the content of the wavelength-conversion material 20 can be formed.

In the methods of manufacturing a light emitting device according to the first to the third embodiments as mentioned above, after the wavelength-conversion material 20 is predominantly distributed on one surface side of the light-transmissive resin 30, a region of the light-transmissive resin 30 where wavelength-conversion material 20 is not predominantly distributed is removed to thin the covering member 70. With these methods, the thinned covering member 70 can be formed with high processing accuracy.

That is, if the thin first light-reflective member having the through-holes or openings is used and the light-transmissive resin 30 is charged into the through-holes or openings to fabricate the thin covering member, it may be difficult to fabricate the covering member with the high processing accuracy due to, for example, the deformation of the thin first light-reflective member not charged with the light-transmissive resin 30 in the through-holes or openings, or the deformation of the thin first light-reflective member that would occur when the light-transmissive resin 30 is charged and cured in the through-holes or openings, which may occur in the manufacturing process.

However, in methods of manufacturing the light emitting device according to the first to the third embodiments, with use of the relatively-thick first light-reflective member that is easy to handle in the manufacturing procedure, the covering member in which the light-transmissive resin 30 has been charged in the through-holes or openings of the first light-reflective member and cured to produce the coating member with a high strength, and then the high-strength covering member is thinned by polishing, grinding, or the like. With this method, the thin covering member can be fabricated with the high processing accuracy to manufacture the light emitting device.

Therefore, with the methods of manufacturing the light emitting device according to the first to the third embodiments, the light emitting device can be manufactured with the high processing accuracy.

As mentioned above, with the methods of manufacturing the light emitting device according the first to third embodiments, the thin covering member can be manufactured with the high processing accuracy to manufacture the light emitting device. Accordingly, the light emitting device with small variance in light distribution properties can be manufactured.

That is, in case of fabricating the thin covering member without being thinned by polishing, grinding, or the like with use of the thin first light-reflective member having the through-holes or openings into which the light-transmissive resin is charged, variance in the shape of the light-transmissive resin obtained after curing tends to become large, which might lead to large variance in light distribution properties.

For example, in the case where the light-transmissive resin is applied into the through-holes or openings in the first light-reflective member by potting or the like and is then cured, a phenomenon of the so-called shrinkage may occur, so that the surface of the resin may be recessed. Such recessed surface may lead to degradation in the light extraction efficiency of the light emitting device. Variance of the shape of the surface (e.g., degree of recess of the recessed surface) due to variance in the degree of shrinkage may cause variance in light distribution properties.

However, in the above-mentioned methods of manufacturing the light emitting device in the first to the third embodiments, the region of the light-transmissive resin 30 where the wavelength-conversion material 20 is not predominantly distributed is removed to thin the covering member 70, so that the recessed part formed on the surface due to the shrinkage can be removed and flattened, so that variance in the shape of the surface can be small.

Therefore, the light emitting device with high light extraction efficiency and small variance in light distribution properties can be manufactured.

Fourth Embodiment

A light emitting device 1000 according to a fourth embodiment is one example of the light emitting device fabricated by the methods of manufacturing the light emitting device of the first to the third embodiments. The light emitting device 1000 according to the fourth embodiment includes: the covering member including the first light-reflective member 10 with through-holes, and the light-transmissive resin 30, which is disposed in the through-holes of the first light-reflective member 10 and contains wavelength-conversion materials 20; the light-emitting element 40 facing the light-transmissive resin 30; and the second light-reflective member 50 covering lateral surfaces of the light-emitting element 40 and facing the first light-reflective member around the light-emitting element 40. The wavelength-conversion material 20 is predominantly distributed on the side of the surface of the light-transmissive resin 30 facing the light-emitting element 40. That is, the surface of the light-transmissive resin 30 where the wavelength-conversion material 20 is predominantly distributed faces a light extraction surface 401 of the light-emitting element 40. In the case of mounting the light-emitting element 40 on a base, the light extraction surface 401 of the light-emitting element 40 is referred to as a surface opposite to the surface of the light-emitting element 40 facing the base. In other words, in the case of mounting the light-emitting element 40 in a face-down manner, the light extraction surface refers to a surface opposite to the surface of the light-emitting element on which the electrodes are disposed. In the case of mounting the light-emitting element 40 in a face-up manner, the light extraction surface is referred to as the surface of the light-emitting element on which the electrodes are disposed. Furthermore, the surface having the electrodes thereon is referred to as an electrode formation surface.

Figure 8A:
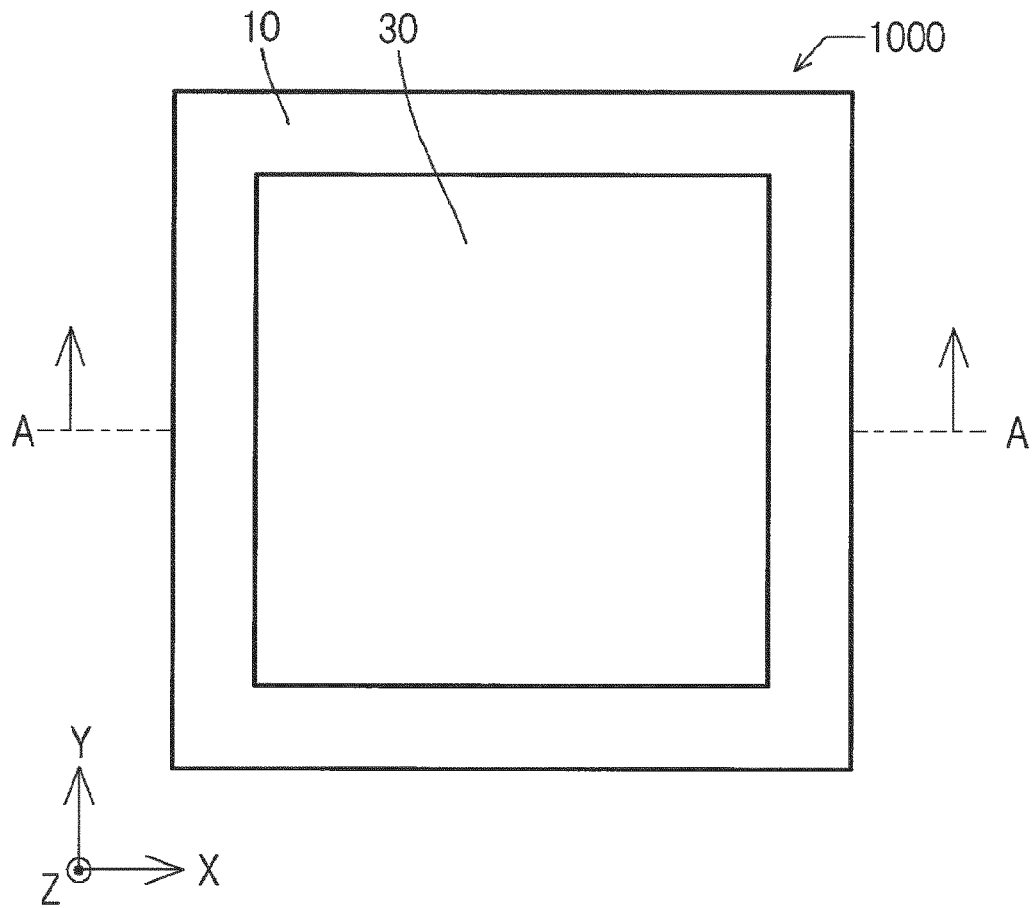
FIG. 8A is a schematic plan view of a light emitting device according to a fourth embodiment.
Figure 8B:
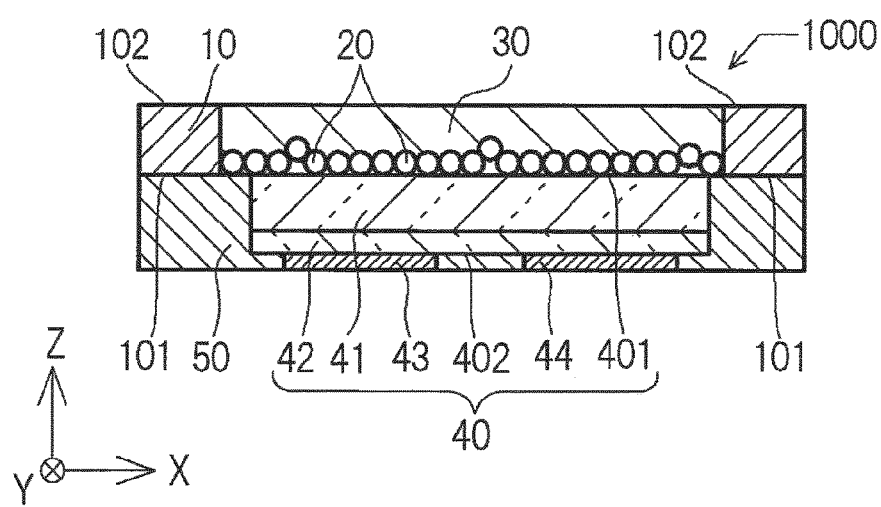
FIG. 8B is a schematic cross-sectional view taken along the line A-A of FIG. 8A.

FIG. 8B is a cross-sectional view taken along the line A-A of FIG. 8A. As shown in FIG. 8B, the light-emitting element 40 includes a light-transmissive substrate 41 and a semiconductor laminated body 42 formed on the lower surface side of the light-transmissive substrate 41. The light-emitting element 40 has the light extraction surface 401 (upper surface) on the light-transmissive substrate 41 side and the electrode formation surface 402 (lower surface) opposite to the light extraction surface. Further, the light-emitting element 40 includes a pair of electrodes 43 and 44 on the electrode formation surface 402 (lower surface). Each of the two electrodes 43 and 44 forming the pair of electrodes can have any shape. Note that the term "electrode formation surface" of the light-emitting element 40 as used in the present specification indicates the surface of the light-emitting element 40 that does not include the electrodes 43 and 44. In the present embodiment, the electrode formation surface 402 corresponds to the lower surface of the semiconductor layered body 42.

The through-hole formed in the first light-reflective member 10 may have an appropriate shape, examples of which include: a shape including a curved line such as a circle, an ellipse, a semicircle, and a semi-ellipse; a polygonal shape such as a triangle and quadrangle; and an irregular shape such as a T shape and an L shape. In order to enhance the extraction efficiency of light emitted from the light-emitting element 40, the light-transmissive resin 30 disposed in each through-hole preferably has a width larger than the region enclosed by the periphery of the light-emitting element 40. With the width of the light-transmissive resin 30 larger than the region enclosed by the periphery of the light-emitting element 40, the amount of light reflected by the first light-reflective member 10 and returning to the light-emitting element 40 can be reduced. On the other hand, in order to improve the visibility of the light emitting device, the width of the light-transmissive resin 30 is preferably smaller than the region enclosed by the periphery of the light-emitting element 40. With the width of the light-transmissive resin 30 smaller than the region enclosed by the periphery of the light-emitting element 40, the area from which the light is extracted can be decreased.

The second light-reflective member 50 covers the lateral surfaces of the light-emitting element 40 and the first light-reflective member 10. The second light-reflective member 50 may cover the electrode formation surface 402 of the light-emitting element 40 so as to expose portions of the electrodes 43 and 44.

In the light emitting device 1000, the wavelength-conversion material 20 is distributed predominantly on the first surface 101 side in the light-transmissive resin 30. With this arrangement, a decrease in the content of the wavelength-conversion material 20 contained in the light-transmissive resin 30 can be reduced, even in the case where portions of the first light-reflective member 10 and the light-transmissive resin 30 on the side where the wavelength-conversion material 20 is not predominantly distributed (on the second surface 102 side) are removed. That is, the light emitting device can be thinned without significantly changing the content of the wavelength-conversion material 20 in the light-transmissive resin 30. Further, even if the thickness of the light-transmissive resin 30 is slightly uneven, the content of the wavelength-conversion material 20 in the light-transmissive resin 30 does not change largely. Preferably, the surface (upper surface) of the light-transmissive resin 30 on the side where the wavelength-conversion material 20 is not predominantly distributed (on the second surface 102 side) is located on the substantially same plane (or is flush with) as the second surface 102 which is the upper surface of the first light-reflective member 10, no stepped portion presents between both surfaces, and both surfaces are flat. In this way, the light emitting device can be further thinned. Note that the expression "flush and no stepped portion" as used herein means that one of both surfaces is not intentionally processed to protrude from the other. Specifically, irregularities with a height of about 50 μm or smaller and preferably about 30 μm or smaller is regarded as the flush part or the part without any stepped portion.

In the light emitting device 1000, the surface of the light-transmissive resin 30 where the wavelength-conversion material 20 is predominantly distributed faces a light extraction surface 401 of the light-emitting element 40. That is, the surface of the light-transmissive resin 30 constituting a part of the upper surface of the light emitting device 1000 and being exposed to the outside air is the surface of the light-transmissive resin 30 where the wavelength-conversion material 20 is not predominantly distributed. Thus, substantially no wavelength-conversion material 20 exists near the surface of the light-transmissive resin 30 exposed to the outside air. With this arrangement, for example, even though the wavelength-conversion material 20 susceptible to moisture is used, the light-transmissive resin 30 can serve as a protective layer, which can suppress the degradation of the wavelength-conversion material 20, so that good color tone can be kept. Examples of the wavelength-conversion material 20 susceptible to moisture include a fluoride-based phosphor, a sulfide-based phosphor, a chloride-based phosphor, a silicate-based phosphor, and a phosphate-based phosphor. In particular, although K2SiF6:Mn as the fluoride-based phosphor is suitable for use as a red phosphor, conventionally, application of K2SiF6:Mn is limited due to its susceptibility to moisture.

However, with the light emitting device according to the fourth embodiment, change of color tone can be reduced even in the case of containing K2SiF6:Mn for the fluoride-based phosphor. When the light emitted from the light-emitting element 40 strikes the wavelength-conversion material 20, it is refracted and scattered by the wavelength-conversion material 20. The upper surface of the light emitting device 1000 is formed of the surface where the wavelength-conversion material 20 is not predominantly distributed in the light-transmissive resin 30. With this arrangement, the portion at which the light is mainly scattered is located in the lower side of the light emitted device, compared to a light emitting device in which the wavelength-conversion material 20 is dispersedly distributed in the light-transmissive resin 30. In this way, in the case where the upper surface of the light emitting device is formed of the surface where the wavelength-conversion material 20 in the light-transmissive resin 30 is not eccentrically located, the light emitting device can have good visibility.

Fifth Embodiment

Figure 9:
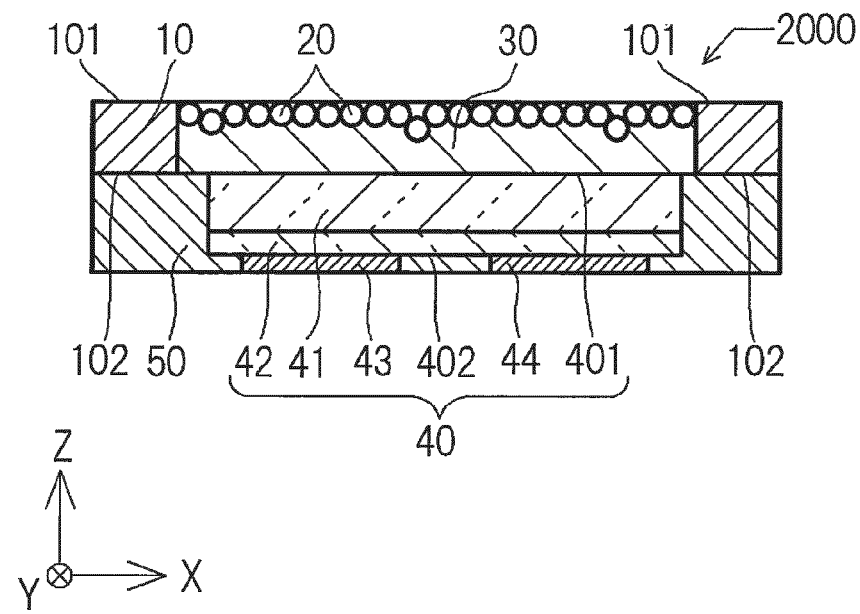
FIG. 9 is a schematic cross-sectional view of a light emitting device according to a fifth embodiment.

As shown in FIG. 9, a light emitting device 2000 in a fifth embodiment differs from the light emitting device 1000 in the fourth embodiment in that the surface of the light-transmissive resin 30 opposite to the surface thereof where the wavelength-conversion material 20 is predominantly distributed faces the light extraction surface 401 of the light-emitting element 40. The fifth embodiment is the same as the fourth embodiment except for the above-mentioned point.

Preferably, on the side where the wavelength-conversion material 20 is not predominantly distributed (the second surface 102 side), the first light-reflective member 10 and the light-transmissive resin 30 are flush with each other, no stepped portion presents between both surfaces, and both surfaces are flat. In this way, the light emitting device can be further thinned. Note that the expression "flush and no stepped portion" as used herein means, similarly to the fourth embodiment, that one of both surfaces is not intentionally processed to protrude from the other. Specifically, irregularities with a height of about 50 μm or smaller and preferably about 30 μm or smaller are allowable.

In the fifth embodiment, the part of the light-transmissive resin 30 at which wavelength-conversion material 20 is not predominantly distributed is disposed between the light-emitting element 40 and the side of the resin where the wavelength-conversion material 20 is predominantly distributed. With this arrangement, the distance between the light-emitting element 40 and the wavelength-conversion material 20 can be made longer, compared to the case in which the wavelength-conversion material 20 is dispersed in the light-transmissive resin 30. Accordingly, the heat generated from the light-emitting element 40 can be suppressed from being transferred to the wavelength-conversion material 20 even in the use of, for example, the wavelength-conversion material 20 susceptible to heat or having large variations in its excitation efficiency depending on its temperature. Therefore, good color tone can be maintained. Examples of the wavelength-conversion material 20 susceptible to the heat or having large variations in its excitation efficiency depending on its temperature include a quantum dot phosphor, a chloro-silicate phosphor, and a P-sialon phosphor.

Sixth Embodiment

Figure 10:
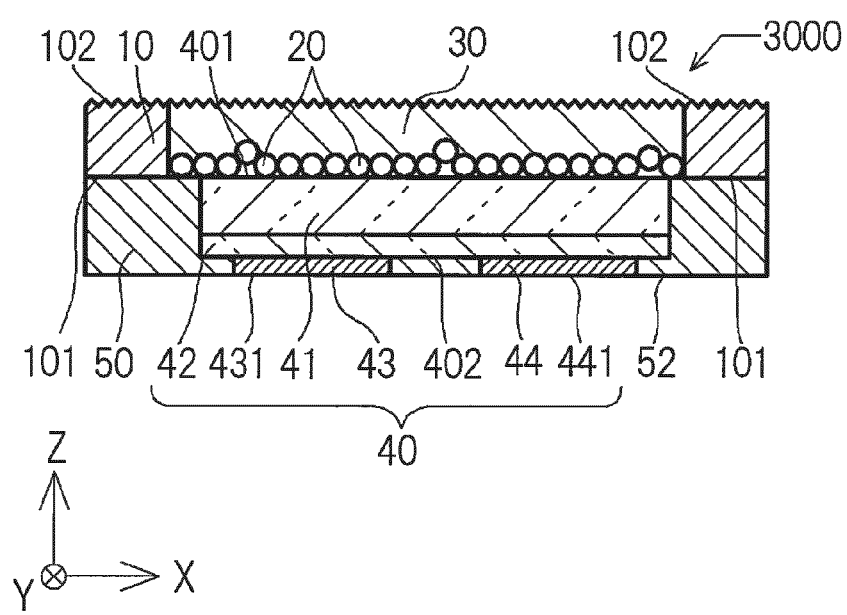
FIG. 10 is a schematic cross-sectional view of a light emitting device according to a sixth embodiment.

A light emitting device 3000 in a sixth embodiment shown in FIG. 10 differs from the light emitting device 1000 according to the fourth embodiment in that the upper surface of the light emitting device 3000 is rougher than the lower surface of the light emitting device 3000. In other words, the lower surface of the light emitting device 3000 is flatter than the upper surface of the light emitting device 3000. The sixth embodiment is the same as the fourth embodiment except for the above-mentioned point.

The upper surface of the light emitting device 3000 includes the second surface of the first light-reflective member 10 and a surface opposite to the surface of the light-transmissive resin 30 toward which the wavelength-conversion material is predominantly distributed. The lower surface of the light emitting device 3000 includes a surface 52 opposite to the surface of the second light-reflective member 50 facing the first light-reflective member 10, and exposed surfaces 431 and 441 that are surfaces of the electrodes of the light-emitting element exposed from the second light-reflective member. The second surface 102 of the first light-reflective member 10 that constitute a part of the upper surface of the light emitting device 3000 is preferably rougher than each of the exposed surfaces 431 and 441. Alternatively, in the light-transmissive resin 30 which forms a part of the upper surface of the light emitting device 300, one surface of the light-transmissive resin 30 opposite to the other surface thereof where the wavelength-conversion material is predominantly distributed is preferably rougher than the exposed surfaces 431 and 441.

Roughening the upper surface of the light emitting device 3000 can reduce tackiness, which makes it easier to handle the light emitting device 3000 at the time of mounting it. Note that the exposed surfaces 431 and 441 form a part of the lower surface of the light emitting device 3000 and serve as the surfaces of the electrodes of the light-emitting element exposed from the second light-reflective member, and hence these surfaces 431 and 441 are preferably substantially flat. The exposed surfaces 431 and 441 preferably have a higher specular reflectivity than that of the lower surface of the second light-reflective member (surfaces around the exposed surfaces 431 and 441). With this structure, a difference in contrast between the exposed surfaces and the second light-reflective member 50 can be increased. Large contrast difference around the exposed surfaces 431 and 441 allows for easy recognition of the electrodes 43 and 44. The second surface 102 and the surface of the light-transmissive resin 30 opposite to the surface thereof where the wavelength-conversion material is predominantly distributed may have an appropriate arithmetic average roughness Ra. However, to easily handle the light emitting device, the arithmetic average roughness Ra of the second surface is preferably in a range of 0.05 to 10 μm, and more preferably in a range of 0.07 to 5 μm. The surface of the light-transmissive resin 30 opposite to the surface thereof where the wavelength-conversion material is predominantly distributed may have an appropriate arithmetic average roughness Ra. However, in order to easily handle the light emitting device, the arithmetic average roughness Ra of this surface is preferably in a range of 0.05 to 10 μm, and more preferably in a range of 0.07 to 5 μm. Each of the exposed surfaces 431 and 441 may have an appropriate arithmetic average roughness Ra. However, in order to easily recognize the exposed surfaces, the arithmetic average roughness Ra arithmetic average roughness Ra is preferably 0.1 μm or less, more preferably 0.05 μm or less, and much more preferably 0.025 μm or less.

Ra can be measured in conformity with the measurement method of the surface roughness of JIS0601-1976. More specifically, Ra can be represented by the formula in [Equation 1], in which a part with a measurement length L is extracted from a roughness curve in the direction of its central line, the central line of the extracted part is represented as the X axis, the axial magnification direction is represented as the Y axis, and the roughness curve represented as y=f(x).

$$Ra = 1/L \times \int_0^4 |f(x)| dx$$

Value of Ra is represented in unit of micrometer. The Ra can be measured by using a contact surface roughness gauge or a laser microscope. Note that the arithmetic average roughness Ra in the present specification is measured by using SURFCOM480A-12 manufactured by TOKYO SEIMITSU Co., Ltd.

Also in the light emitting device 2000, the first surface 101 of the first light-reflective member 10, which serves as the upper surface of the light emitting device 2000, and the surface of the light-transmissive resin 30 where the wavelength-conversion material 20 is predominantly distributed are preferably rougher than the exposed surfaces 431 and 441 forming a part of the lower surface of the light emitting device 2000. With this structure, similarly to the light emitting device 3000, the light emitting device 2000 can be easily handled.

Seventh Embodiment

Figure 11:
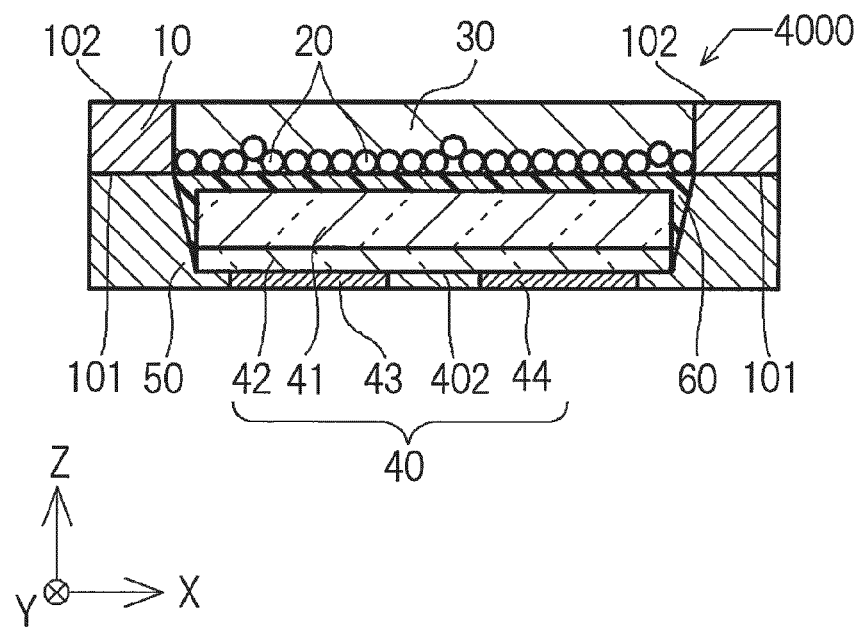
FIG. 11 is a schematic cross-sectional view of a light emitting device according to a seventh embodiment.
Figure 12:
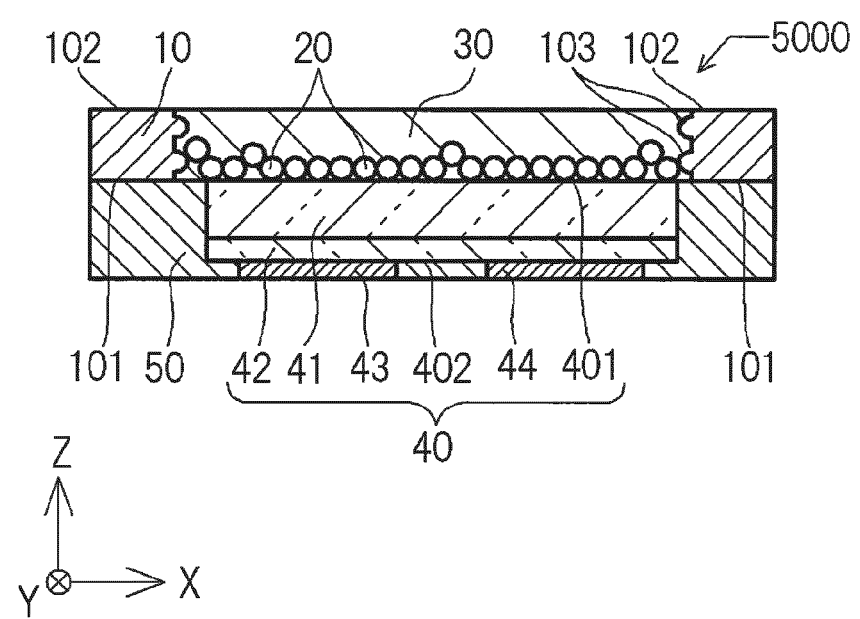
FIG. 12 is a schematic cross-sectional view of a light emitting device according to an eighth embodiment.

A light emitting device 4000 according to a seventh embodiment shown in FIG. 11 differs from the light emitting device 1000 according to the fourth embodiment in that the light-emitting element 40 and the light-transmissive resin 30 are bonded together via the bonding member 60. The seventh embodiment is the same as the fourth embodiment except for the above-mentioned point.

It is preferable to arrange the bonding member 60, which is light-transmissive, between the light-emitting element 40 and the light-transmissive resin 30 because using the bonding member 60 allows the light-emitting element 40 and the light-transmissive resin 30 to be easily bonded together. Also, arrangement of the bonding member 60 between the light-emitting element 40 and the light-transmissive resin 30 causes the refraction or reflection of light at the interface between the bonding member 60 and the light-transmissive resin 30. Accordingly, the color unevenness and the luminance unevenness can be reduced. The refractive index of the bonding member 60 is preferably closer to that of the light extraction surface 401 of the light-emitting element 40 rather than that of the light-transmissive resin 30, which allowed the extraction efficiency of light from the light-emitting element 40 to be enhanced.

In the case where the bonding member 60 is formed up to the side surfaces of the light-emitting element 40, the light emitted from the side surfaces of the light-emitting element 40 can be extracted from the light emitting device 4000 through the bonding member 60, which can enhance the light extraction efficiency.

In the case where a width of the light-transmissive resin 30 is larger than the region defined by the outer edge of the light-emitting element 40, the bonding member 60 is preferably bonded with the light-transmissive resin 30 so that the area of the bonding member 60 that contacts the light extraction surface 401 of the light-emitting element 40 is larger than the area of the light extraction surface 401 of the light-emitting element 40. With this arrangement, light emitted from the light-emitting element 40 is introduced to the light-transmissive resin 30 through the region at which the bonding member 60 and the light-transmissive resin 30 is bonded, the area of which is larger than the area of the light extraction surface 401, so that color unevenness and luminance unevenness can be reduced. The bonding member 60 more preferably covers the whole surface of the light-transmissive resin 30 facing the light-emitting element 40. In this way, light emitted from the light-emitting element 40 can be introduced into the whole surface of the light-transmissive resin 30 facing the light-emitting element 40, so that the color unevenness and the luminance unevenness can be further reduced.

Note that the above-mentioned effects can be obtained even with the arrangement in which the surface of the light-transmissive resin 30 opposite to the surface thereof where the wavelength-conversion material 20 is predominantly distributed faces the light extraction surface 401 of the light-emitting element 40, like the light emitting device 2000 of the fifth embodiment.

Eighth Embodiment

A light emitting device 5000 according to an eighth embodiment shown in FIGS. 12, 13A, 13B, and 13C differs from the light emitting device 1000 according to the fourth embodiment in that the protrusions 103 are arranged on the sidewall of the through-hole of the first light-reflective member 10. The eighth embodiment is the same as the fourth embodiment except for the above-mentioned point.

With the protrusions 103 on the sidewall of the through-hole, light emitted from the light-emitting element 40 can be reflected by the protrusions 103, and a large amount of light can be struck on the wavelength-conversion material 20, which can improve the color unevenness. The location of each protrusion 103 is not specifically limited. Similarly to the light emitting device 5000 shown in FIG. 12, in the case where the upper surface of the light emitting device is formed of the second surface 102 of the first light-reflective member 10, each protrusion 103 is preferably located closer to the second surface 102 rather than to the first surface 101 of the first light-reflective member 10. With this arrangement, light reflected by the protrusion 103 is more likely to be struck on the wavelength-conversion material 20, which can improve color unevenness. The protrusion 103 is preferably formed in the position closer to the upper surface of the light emitting device rather than the light extraction surface of the light-emitting element. This can improve the visibility of the light emitting device. For improving visibility, forming the protrusion 103 can use a larger amount of the light-transmissive resin 30 compared to decreasing the size of the through-hole, so that forming the protrusion 103 can further reduce the color unevenness. Note that the term "location of the protrusion 103" as used in the present specification refers to a location of a tip end of the protrusion 103.

Figure 13A:
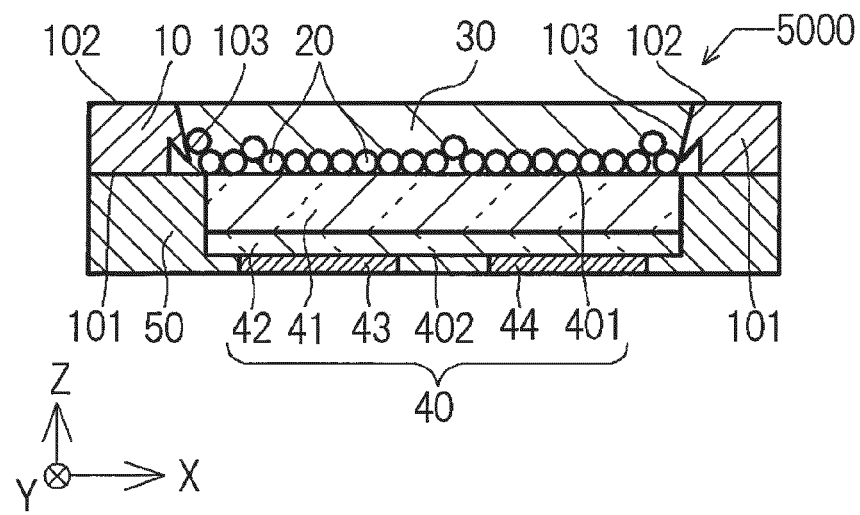
FIG. 13A is a schematic cross-sectional view of a light emitting device according to a first modified example of the eighth embodiment.
Figure 13B:
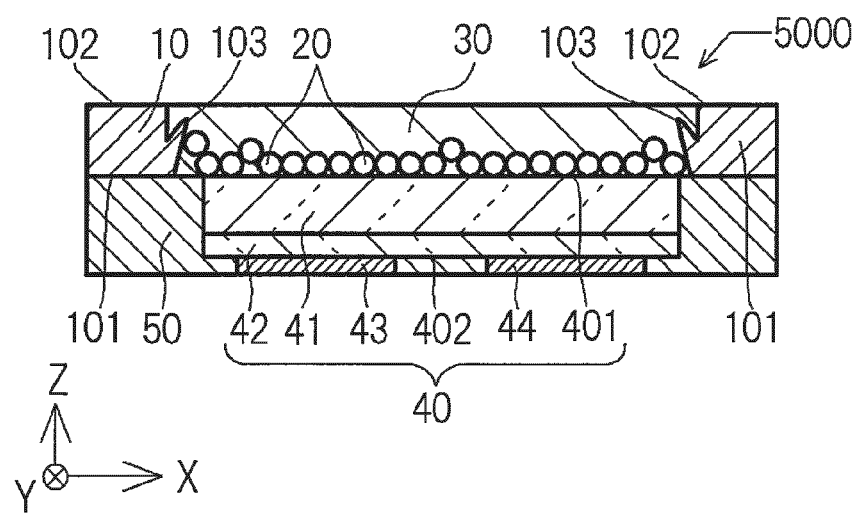
FIG. 13B is a schematic cross-sectional view of a light emitting device according to a second modified example of the eighth embodiment.
Figure 13C:
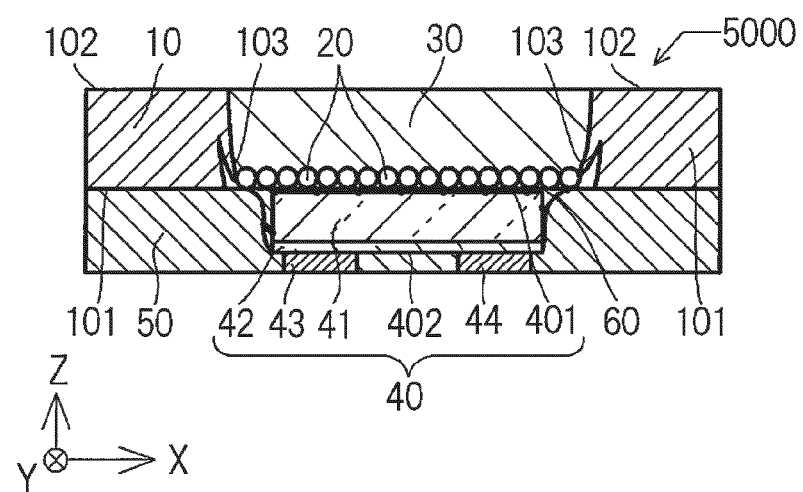
FIG. 13C is a schematic cross-sectional view of a light emitting device according to a third modified example of the eighth embodiment.

The presence of the protrusion 103 on the sidewall of the through-hole can increase the adhesive area between the first light-reflective member 10 and the light-transmissive resin 30 containing the wavelength-conversion material 20, which can enhance the adhesive force therebetween. As shown in FIG. 13A, the protrusion 103 may be inclined and protruded toward the first surface 101 side. In other words, the protrusion 103 may be inclined toward the first surface 101 side. With inclination of the protrusion 103, the adhesive area can be increased, so that adhesive force can be enhanced. As shown in FIG. 13B, the protrusion 103 may be inclined and protruded toward the second surface 102 side. In other words, the protrusion 103 may be inclined toward the second surface 102 side. Even with this arrangement, the adhesive area between the first light-reflective member 10 and the light-transmissive resin 30 can be increased to enhance the adhesive force. Furthermore, reflection pf light emitted from the light-emitting element 40 by the protrusion 103 allows the light more likely to be directed toward the upper surface of the light emitting device, which can improve the light extraction efficiency. As shown in FIG. 13C, the light-emitting element 40 and the light-transmissive resin 30 may be bonded together via the bonding member 60. With this arrangement, refraction or reflection of light occurs at the interface between the bonding member 60 and the light-transmissive resin 30, and also light reflection by the protrusions 103 occurs, so that color unevenness can be further improved.

Ninth Embodiment

Figure 14A:
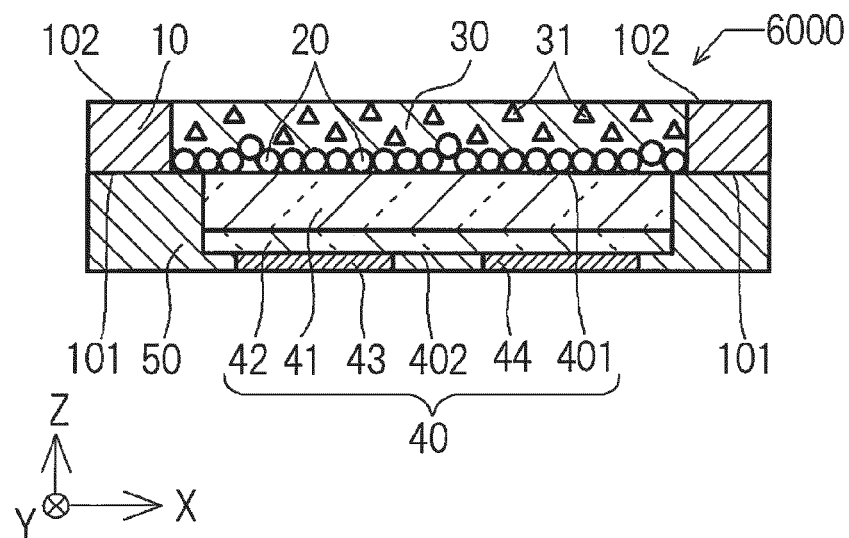
FIG. 14A is a schematic cross-sectional view of a light emitting device according to a ninth embodiment.
Figure 14B:
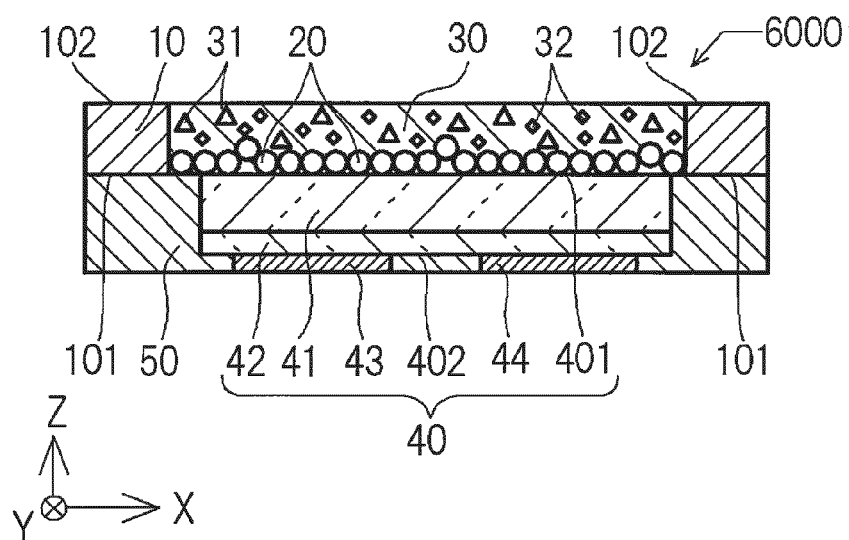
FIG. 14B is a schematic cross-sectional view of a light emitting device according to a modified example of the ninth embodiment.

A light emitting device 6000 according to the present embodiment shown in FIGS. 14A and 14B differs from the light emitting device 1000 according to the fourth embodiment in that light diffusion material is contained in the light-transmissive resin 30. FIG. 14A shows that a first light diffusion material 31 is contained in the light-transmissive resin 30, whereas FIG. 14B shows that the first light diffusion material 31 and a second light diffusion material 32 are contained in the light-transmissive resin 30. The ninth embodiment is the same as the fourth embodiment except for the above-mentioned point.

As illustrated in FIG. 14A, the light-transmissive resin 30 preferably contains the first light diffusion material 31, which can adjust its refractive index. The refractive index of the first light diffusion material at 25° C. (normal temperature) is preferably higher than that of the light-transmissive resin at 25° C. (normal temperature). Thus, a difference in the refractive index between the light-transmissive resin 30 and the first light diffusion material 31 at a high temperature (100° C.) is larger than that at the normal temperature (25° C.). This is because the light-transmissive resin 30 reduces its refractive index due to the thermal expansion when its temperature increases due to driving of the light emitting device or the like. Typically, the first light diffusion material 31 does not decrease its refractive index as much as the light-transmissive resin 30 even when its temperature increases. Further, the wavelength-conversion efficiency of the wavelength-conversion material 20 is degraded when its temperature increases. At a high temperature (100° C.), the difference in the refractive index between the light-transmissive resin 30 and the first light diffusion material 31 increases, which increase light reflectivity of the first light diffusion material 31 with respect to light emitted from the light-emitting element 40, so that an optical path length in which light emitted from the light-emitting element 40 passes through the light-transmissive resin 30 can be increased. Thus, the amount of light striking the wavelength-conversion material 20 increases, so that color unevenness can be reduced even when the fluorescent-emission efficiency of the wavelength-conversion material 20 is reduced.

Preferably, the first light diffusion material 31 is uniformly dispersed in the light-transmissive resin 30. The uniform dispersion of the first light diffusion material 31 can reduce the color unevenness in the light-transmissive resin

30. Preferably, the first light diffusion material 31 is dispersed in the light-transmissive resin 30, and the wavelength-conversion material 20 is distributed predominantly between the first light diffusion material 31 and the light extraction surface 401 of the light-emitting element 40. That is, the first light diffusion material is preferably contained in a region of the light-transmissive resin other than the region where the wavelength-conversion material is not predominantly distributed. With this arrangement, the light emitted from the light-emitting element 40 is more likely to be reflected by the first light diffusion material 31 and then to strike the wavelength-conversion material 20, which can further reduce the color unevenness in the light-transmissive resin 30. Thus, although the wavelength-conversion material 20 is unevenly distributed, a material for the first light diffusion material 31 is preferably selected from materials that is less likely to precipitate in the non-cured or semi-cured light-transmissive resin 30, compared to the wavelength-conversion material 20 in that, and that can maintain to be uniformly dispersed. Specifically, in the case of selecting phosphor particles having an average grain size of 5 µm to 20 µm for the wavelength-conversion material 20, for example, powder material having an average grain size of 0.1 µm to 3 µm, preferably, 0.2 µm to 1 µm can be used for the first light diffusion material 31. Furthermore, the first light diffusion material 31 is contained to enable adjustment of the viscosity of the light-transmissive resin 30. This arrangement is preferable because it allows the light-transmissive resin 30 to be formed easily.

As shown in FIG. 14B, the first light diffusion material 31 and the second light diffusion material 32 may be contained in the light-transmissive resin 30. At this time, preferably, the refractive index of the first light diffusion material at 25° C. (normal temperature) is higher than that of the light-transmissive resin at 25° C. (normal temperature), whereas the refractive index of the second light diffusion material at 100° C. (high temperature) is lower than that of the light-transmissive resin 30 at 100° C. (high temperature). With this arrangement, at a high temperature (100° C.), compared with the normal temperature (25° C.), the difference between the refractive index of the light-transmissive resin 30 and that of the first light diffusion material 31 is increased, whereas the difference between the refractive index of the light-transmissive resin 30 and that of the second light diffusion material 32 is reduced. Accordingly, the difference between the refractive index of the light-transmissive resin 30 and that of the first light diffusion material 31 and the difference between the refractive index of the light-transmissive resin 30 and that of the second light diffusion material 32 are complementary to each other, which can further reduce the color unevenness due to the change in temperature. The first light diffusion material 31 and the second light diffusion material 32 are preferably dispersed in the light-transmissive resin 30. The dispersion of the first and second light diffusion materials 31 and 32 can reduce the color unevenness in the light-transmissive resin 30. Alternatively, two or more kinds of light diffusion materials may be contained in the light-transmissive resin 30.

Note that unless otherwise specified, the refractive index in the present specification is a value at a peak wavelength of the light from the light-emitting element. Further, unless otherwise specified, the difference in the refractive index is represented by the absolute value. The refractive index can be measured, for example, by an Abb refractometer. In the case where the refractive index of a member cannot be measured with the Abb refractometer due to the size of the member to be measured or the like, the member to be measured is specified, and a refractive index of a material similar to the specified member is measured. Then, the refractive index of the specified component can be deduced from the measurement result of the similar material.

Tenth Embodiment

Figure 15A:
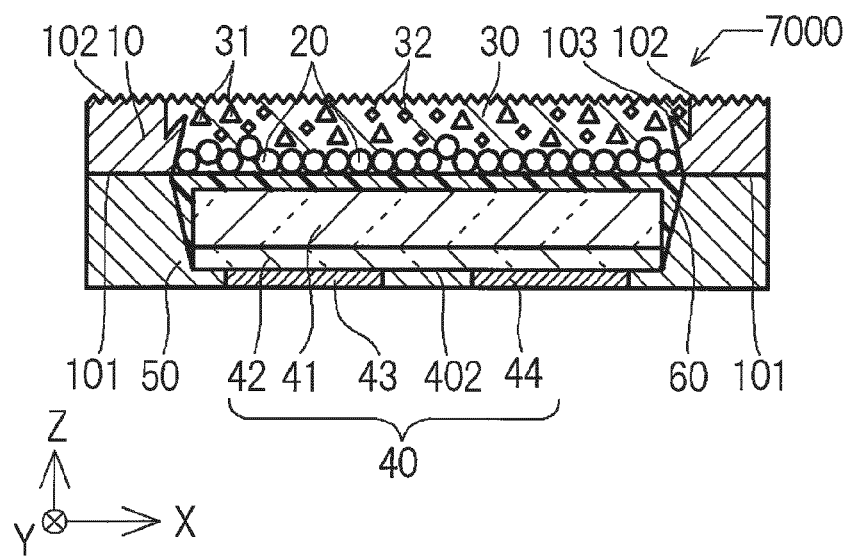
FIG. 15A is a schematic cross-sectional view of a light emitting device according to a tenth embodiment.

A light emitting device 7000 according to a tenth embodiment as shown in FIG. 15A differs from the light emitting device 1000 according to the fourth embodiment in that an upper surface of the light emitting device 7000 is rougher than a lower surface of the light emitting device 7000, that the light-emitting element 40 and the light-transmissive resin 30 are bonded together via the bonding member 60, that sidewalls of a through-hole of the first light-reflective member 10 have the protrusions 103, and that the light diffusion material is contained in the light-transmissive resin 30. The tenth embodiment is the same as the fourth embodiment except for the above-mentioned point.

The upper surface of the light-transmissive resin 30 forming the upper surface of the light emitting device 7000 is roughened. With this arrangement, light emitted from the light-emitting element 40 is more likely to be reflected by the upper surface of the light-transmissive resin 30. Accordingly, color unevenness can be reduced in the light-transmissive resin 30. The light-emitting element 40 and the light-transmissive resin 30 may be bonded together via the bonding member 60. Part of the light emitted from the light-emitting element 40 is refracted or reflected via the bonding member 60 at the interface between the bonding member 60 and the light-transmissive resin 30, so that color unevenness can be reduced. The protrusions 103 are disposed at the sidewalls of the through-hole in the first light-reflective member 10. Thus, a portion of light emitted from the light-emitting element 40 is reflected by the protrusion 103, which can further reduce color unevenness. The light diffusion material (first light diffusion material 31, second light diffusion material 32) is contained in the light-transmissive resin 30. With this configuration, a portion of light emitted from the light-emitting element 40 is reflected or reflected by the light diffusion material, which can reduce color unevenness. With this arrangement, the optical path length in which light emitted from the light-emitting element 40 propagates in the light-transmissive resin 30 can be increased, so that color unevenness can be reduced.

Figure 15B:
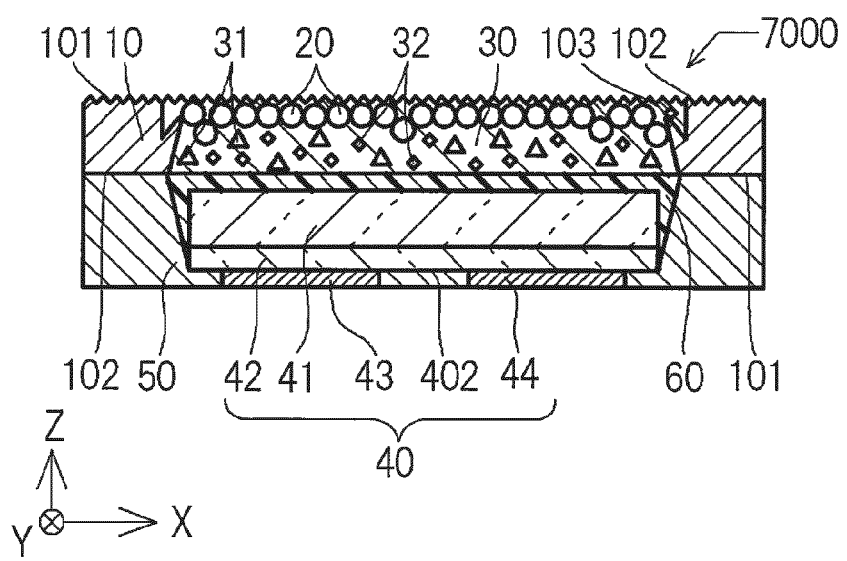
FIG. 15B is a schematic cross-sectional view of a light emitting device according to a modified example of the tenth embodiment.

A light emitting device 7000 according to an embodiment shown in FIG. 15B is a modified example of FIG. 15A, and differs from the structure of FIG. 15A in that the surface of the light-transmissive resin 30 opposite to the surface thereof where the wavelength-conversion material 20 is predominantly distributed is disposed so as to face the light extraction surface 401 of the light-emitting element 40. The structure shown in FIG. 15B is substantially the same as that shown in FIG. 15A except for the points mentioned above. Even with this arrangement, the optical path length in which light emitted from the light-emitting element 40 propagates in the light-transmissive resin 30 can be increased, so that color unevenness can be reduced.

Materials and the like for each components of the light-emitting devices in the fourth to tenth embodiments will be described below.

Light-Emitting Element 40

For the light-emitting element 40, a semiconductor light-emitting element such as a light-emitting diode can be used. The semiconductor light-emitting element can include the light-transmissive substrate 41, and the semiconductor laminated body 42 formed thereon.

Light-Transmissive Substrate 41

Examples of materials for the light-transmissive substrate 41 of the light-emitting element 40 include, light-transmissive insulating materials such as sapphire (Al2O3) and spinel (MgAl2O4), semiconductor materials that allow the light from the semiconductor layered body 42 to pass therethrough (e.g., nitride-based semiconductor material).

Semiconductor Layered Body 42

The semiconductor layered body 42 includes a plurality of semiconductor layers. One example of the semiconductor laminated body 42 include three semiconductor layers, namely, a first conductive-type semiconductor layer (e.g., n-type semiconductor layer), a light-emission layer (active layer), and a second conductive-type semiconductor layer (e.g., p-type semiconductor layer). The semiconductor layers can be formed of semiconductor material, such as a III-V group compound semiconductor and a II-VI group compound semiconductor. Specifically, examples of the semiconductor material include nitride-based semiconductor materials such as InXAlYGa1-X—YN (0≤X, 0≤Y, X+Y≤1) (e.g., InN, AlN, GaN, InGaN, AlGaN, InGaAlN, etc.)

Electrodes 43 and 44

Electrodes 43 and 44 of the light-emitting element 40 can be formed of good electrical conductors. Examples of suitable material for the electrodes include metal, such as Cu.

First Light-Reflective Member 10

The first light-reflective member 10 can be any member having a reflectivity of 60% or more, and preferably 70% or more with respect to light from the light-emitting element. With this member, light reached the first light-reflective member can be reflected to be directed toward the outside of the light-transmissive resin, which can enhance the light extraction efficiency of the light emitting device.

Examples of material for the first light-reflective member include metal and light-reflective materials (e.g., titanium oxide, silicon dioxide, titanium dioxide, zirconium dioxide, potassium titanate, alumina, aluminum nitride, boron nitride, mullite, niobium oxide, barium sulfate, various kinds of rare-earth oxides (e.g., yttrium oxide, gadolinium oxide)). The first light-reflective member may be made of a resin, an inorganic material, glass, etc., or a complex thereof that contains the light-reflective materials. Note that the content of the light-reflective material in the resin, inorganic material, glass, and a complex thereof is appropriately selected, but the content of the light-reflective material is 10 to 95% by weight, preferably 30 to 80% by weight, and more preferably about 40 to 70% by weight, with respect to the weight of the first light-reflective member. Further, preferably, the light-reflective material is dispersed in the resin to form the first light-reflective member, which can facilitate processing such as etching, cutting, grinding, polishing, blasting, and the like.

Examples of resin materials that can be used for the first light-reflective member include, particularly, thermosetting resins such as a silicone resin, a modified silicone resin, an epoxy resin, and a phenol resin; and thermoplastic resins such as a polycarbonate resin, an acrylic resin, a methylpentene resin, and a polynorbornene resin. In particular, a silicone resin is preferable because of its good resistance to light and heat.

Examples of inorganic materials that can be used for the first light-reflective member include ceramics or low-temperature co-fired ceramics such as aluminum oxide, aluminum nitride, zirconium oxide, zirconium nitride, titanium oxide, titanium nitride, zinc oxide, and a mixture thereof. The first light-reflective member may be a single-layer film or a laminated film using these materials.

Second Light-Reflective Member 50

The second light-reflective member can be formed using a material similar to that of the first light-reflective member. Material for the second light-reflective member may be the same as that of the first light-reflective member, but may be different from that depending on the required properties for the second light-reflective member. For example, the content of the light-reflective material in the first light-reflective member may differ from that in the second light-reflective member. The second light-reflective member covers the lateral surfaces of the light-emitting element, and thus the second light-reflective member may be required to have a higher strength than the strength of the first light-reflective member. For this reason, in the case of forming the first and second light-reflective members from resin containing the light-reflective material, the content of the light-reflective material in the second light-reflective member may be decreased compared to that in the first light-reflective member in order not to reduce the strength of the second light-reflective member. With this structure, the reflectivity of the first light-reflective member that is required to have higher reflectiveness can be increased. The first light-reflective member may be required to have enough strength to undergo a process of removing a part thereof. In this case, the content of the light-reflective material in the first light-reflective member may be less than that in the second light-reflective member. With this arrangement, the strength of the first light-reflective member can be higher than that of the second light-reflective member. Note that the first and second light-reflective members may be formed of different materials. Specifically, for example, the first light-reflective member may be formed of metal or light-reflective material, while the second light-reflective member may be formed of resin containing the light-reflective material.

Light-Transmissive Resin 30

The light-transmissive resin is a member disposed on the light extraction surface side of the light-emitting element to protect the light-emitting element from exterior environment and to optically control the light output from the light-emitting element. Examples if materials for the light-transmissive resin can include thermosetting resins such as silicone resin, modified silicone resin, epoxy resin, and phenol resin; and thermoplastic resins such as polycarbonate resin, acrylic resin, methylpentene resin, and polynorbornene resin. In particular, silicone resin is preferable because of its good resistance to light and heat. The light-transmissive resin preferably has a high light transmissivity. Thus, normally, no additive that reflects, absorbs, or scatters the light is preferably added to the light-transmissive resin. However, in order to impart desired properties to the light-transmissive resin, some additives may be preferably added to the light-transmissive resin.

Wavelength-Conversion Material 20

For the wavelength-conversion material, for example, phosphor particles that can be excited with light emitted from the light-emitting element can be used. Examples of the phosphors that can be excited with the light from a blue light-emitting element or an UV light-emitting element include an yttrium aluminum garnet based phosphor activated with cerium (Ce:YAG), a lutetium aluminum garnet based phosphor activated with cerium (Ce:LAG), a nitrogen-containing calcium aluminosilicate based phosphor activated with europium and/or chromium (CaO—Al2O3-SiO2), a silicate based phosphor activated with europium ((Sr, Ba)2 SiO4), nitride based phosphors such as β-SiAlON phosphor, CASN based phosphor and SCASN based phosphor, a fluoride based phosphor such as a KSF based phosphor, a sulfide based phosphor, a chloride based phosphor, a silicate based phosphor, a phosphate based phosphor, and a quantum-dot phosphor. The KSF based phosphor can be represented by the general formula below:

$$A2[M1-aMn4+aF6] \quad (I)$$

(where A is at least one kind of cation selected from the group consisting of K+, Li+, Na+, Rb+, Cs+, and NH4+; M is at least one element selected from the group consisting of the group 4 elements and group 14 elements; and "a" satisfies a relationship of 0.01<a<0.20). Also, the phosphor may be a fluoride based phosphor which can be represented by the general formula (I) where A represents K+ and M represents Si. The combination of these phosphors and the blue light-emitting element or UV light-emitting element can produce light emitting devices for emitting various colors (e.g., a white based light emitting device).

Bonding Member 60

The bonding member can be formed of resin having light-transmissiveness. Examples of materials for the bonding member include, particularly, thermosetting light-transmissive resins such as silicone resin, modified silicone resin, epoxy resin, and phenol resin. The bonding member is in contact with the side surfaces of the light-emitting element and thus is susceptible to heat generated from the light-emitting element during lighting. The thermosetting resin possesses good heat resistance, and thus is appropriate for the bonding member. The bonding member preferably has high light transmissivity. Thus, normally, it is preferable that no additive that reflects, absorbs, or scatters light is added to the bonding member. However, in order to impart the desired properties to the bonding member, some additives are preferably added to the bonding member in some cases. For example, various kinds of fillers may be added to the bonding member in order to adjust the refractive index of the bonding member or to adjust the viscosity of the bonding member before curing.

First Light Diffusion Material 31, Second Light Diffusion Material 32

Examples of the materials for the first and second light diffusion materials 31 and 32 include oxides such as SiO2, Al2O3, Al(OH)3, MgCO3, TiO2, ZrO2, ZnO, Nb2O5, MgO, Mg(OH)2, SrO, In2O3, TaO2, HfO, SeO, Y2O3, CaO, Na2O, B2O3, SnO, and ZrSiO4; nitrides such as SiN, AlN, and AlON; and fluorides such as MgF2, CaF2, NaF, LiF, and Na3AlF6. These various compounds may be used singly, or alternatively some of these materials may be melted and mixed together to be used as glass or the like. Further, alternatively, the first light diffusion material 31 and/or the second light diffusion material 32 may be formed as a multilayered structure in which a plurality of the materials are stacked.

In particular, with use of the glass, the refractive index of the light diffusion material can be appropriately controlled. The grain size of the light diffusion material can be appropriately selected from a range of 0.01 to 100 µm. The content of each light diffusion material needs to be adjusted depending on the volume of the coating resin and the grain size of the light diffusion material, so that cannot be univocally decided.

While some embodiments according to the present invention have been exemplified above, it is apparent that the present invention is not limited to the above-mentioned embodiments and can have any form without departing from the scope of the present invention.

DESCRIPTION OF REFERENCE NUMERALS 1000, 2000, 3000, 4000, 5000, 6000, 7000: Light emitting device
10: First light-reflective member
20: Wavelength-conversion material
30: Light-transmissive resin
31: First light diffusion material
32: Second light diffusion material
40: Light-emitting element
41: Light-transmissive substrate
42: Semiconductor laminated body
43, 44: Electrode
50: Second light-reflective member
60: Bonding member
70: Covering member
80: Support member
90: Upper die
91: Holding member
92: Lower die
101: First surface
102: Second surface
103: Protrusion
106: Through-hole
107: Recess
108: Cutting portion
401: Light extraction surface
402: Electrode formation surface

What is claimed is:

1. A method of manufacturing a plurality of light emitting devices, the method comprising:
   manufacturing a covering member, which comprises:
   providing a first light-reflective member comprising a plurality of through-holes, each of the through-holes having first and second openings;
   arranging a light-transmissive resin containing a wavelength-conversion material within each of the through-holes;
   distributing the wavelength-conversion material predominantly on a side of the first opening of each of the through-holes within the light-transmissive resin; and
   after the step of distributing the wavelength-conversion material, removing a portion of the light-transmissive resin from a side of the second opening of each of the through-holes;
   providing a plurality of light-emitting elements, each having a light extraction surface;
   bonding the light-transmissive resin of each of the through-holes of the covering member to the light extraction surface of each of light-emitting elements;
   after the step of bonding the light-transmissive resin, forming a second light-reflective member so as to be bonded to the first light-reflective member around each of the light-emitting elements and to cover a lateral surface of each of the light-emitting elements; and
   cutting the first light-reflective member and the second light-reflective member between adjacent light-emitting elements to form a plurality of separate light emitting devices.

2. The method of manufacturing a plurality of light emitting devices according to claim 1, wherein each of the light-emitting elements is bonded to the light-transmissive resin via a bonding member.

3. The method of manufacturing a plurality of light emitting devices according to claim 1, further comprising:

after the step of forming the second light-reflective member, removing a portion of the second light-reflective member to expose an electrode of each of the light-emitting elements.

* * * * *